(12) United States Patent
Tanaka

(10) Patent No.: US 6,496,248 B2
(45) Date of Patent: Dec. 17, 2002

(54) STAGE DEVICE AND EXPOSURE APPARATUS AND METHOD

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/736,156

(22) Filed: Dec. 15, 2000

(65) Prior Publication Data

US 2002/0075469 A1 Jun. 20, 2002

(51) Int. Cl.[7] ............... G03B 27/58; G03B 27/62; G03B 27/42
(52) U.S. Cl. .............. 355/72; 355/53; 355/75
(58) Field of Search ............... 355/53, 30, 72–76; 310/10, 12; 318/135, 649; 378/34–35

(56) References Cited

U.S. PATENT DOCUMENTS

| | | | | |
|---|---|---|---|---|
| 4,989,031 A | * | 1/1991 | Kamiya | 355/30 |
| 5,473,410 A | | 12/1995 | Nishi | 355/53 |
| 5,528,118 A | | 6/1996 | Lee | 318/568.17 |
| 5,559,584 A | * | 9/1996 | Miyaji et al. | 355/73 |
| 5,909,272 A | * | 6/1999 | Osanai et al. | 355/53 |
| 5,982,128 A | | 11/1999 | Lee | 318/568.16 |
| 6,087,797 A | * | 7/2000 | Lee | 318/649 |
| 6,252,314 B1 | * | 6/2001 | Ebinuma | 310/12 |
| 6,271,606 B1 | * | 8/2001 | Hazelton | 310/12 |

* cited by examiner

Primary Examiner—Henry Hung Nguyen
(74) Attorney, Agent, or Firm—Oliff & Berridge, PLC

(57) ABSTRACT

A stage device includes a reaction-force-discharging structure in which a stationary member of a driving mechanism configured with a linear motor and the like disposed in a wafer chamber is connected to an external frame while maintaining the wafer chamber in a hermetic state. When a wafer stage is driven by the linear motor, a reaction force generated by driving the stage is applied to the stationary member. The reaction force is discharged to, e.g., a floor by the reaction-force-discharging structure via an external frame. For example, when the wafer chamber is set to a predetermined atmosphere of gas (including air from which organic substances and the like have been removed), the reaction force caused by driving the wafer stage can be discharged to the outside while maintaining the predetermined atmosphere. In an exposure apparatus using the stage device, accurate exposure is possible by reducing effects of vibration to the greatest extent possible.

51 Claims, 9 Drawing Sheets

STAGE DEVICE AND EXPOSURE APPARATUS AND METHOD

BACKGROUND OF THE INVENTION

1. Field of the Invention

The invention relates to stage devices and exposure apparatus and methods. In particular, the invention relates to stage devices that may be used in an exposure apparatus in which an energy beam having a wavelength of 200 nm or less is used for exposure, and to an exposure-apparatus and method using the stage device.

2. Description of Related Art

Hitherto, various types of exposure apparatus have been used in lithographic processes in the manufacture of semiconductor devices, liquid crystal display devices, and the like. Recently, reduction-projection exposure apparatus of a step-and-repeat type (steppers) and scanning projection exposure apparatus of a step-and-scan type (scanning stepper) are relatively widely used.

In these types of exposure apparatus, patterns of reticles (masks) are transferred onto a plurality of shot regions on a wafer (substrate). To that end, a wafer stage is driven in two-dimensions, in directions X and Y, by a driving mechanism including, for example, a linear motor. A reaction force generated by driving the wafer stage has been discharged by being mechanically transmitted to a floor (ground) by using a frame member disposed on a base (for example, a floor or a base plate as the foundation of the apparatus) vibrationally (dynamically) isolated from the stage, as described in, for example, U.S. Pat. No. 5,528,118.

In the case of the scanning stepper, a reticle stage in addition to the wafer stage must be driven in a given scanning direction. In order to deal with the reaction force generated by driving the reticle stage, a counter-mass structure that relies upon the law of conservation of momentum is generally used along a scanning direction (refer to, for example, U.S. patent application Ser. No. 09/260,544). The counter-mass structure moves in a direction opposite to the direction in which the stage moves in order to discharge (absorb) the reaction force. Movement of the counter-mass also maintains the center of gravity in the movement direction constant to avoid swaying of the apparatus. Another method for discharging a reaction force generated by moving a reticle stage is a method in which the reaction force is mechanically discharged to a base, such as a floor (ground), by using a frame member (see, for example, U.S. patent application Ser. No. 08/416,558).

In the known projection-exposure apparatus, a reaction force resulting from driving a stage is discharged to a base. Vibrations caused in the base by the reaction force have been damped by a vibration isolator, such as an anti-vibration table (vibration-elimination table) on which the projection optical system and stage are mounted, thereby suppressing vibration of the projection optical system and the stage caused by the reaction force.

Recently, vibration isolation has been improved by disposing multiple vibration-isolation tables in an exposure apparatus in situations where the effect of a reaction force, due to driving a stage, on the accuracy of exposure, although small, is non-negligible, even when the reaction force is discharged to a frame disposed directly on a base.

Semiconductor devices and the like have been more highly integrated over the years, thereby making circuit patterns smaller. Thus, projection-exposure apparatus have been required to have higher resolution. In order to improve resolution, it is known to increase the numerical aperture of the projection optical system (NA-increase) and to shorten the wavelength of the exposure beam. A most effective method for improving resolution is to shorten the wavelength of the exposure beam because the NA-increase decreases the depth of focus. Therefore, the wavelength of exposure beams has been decreasing over the years, and an exposure apparatus having, as a light source, an ArF-excimer laser having an output wavelength of 193 nm is at the stage of practical application. Moreover, exposure apparatus having light sources with even shorter wavelengths, such as an $F_2$-laser (output wavelength of 157 nm) and an $Ar_2$-laser (output wavelength of 126 nm), are being considered.

It is believed that the device rule (practical minimum line width) will be 0.1 $\mu$m or less in the future. There is almost no doubt that an electron beam exposure apparatus (hereinafter referred to as "EB-exposure apparatus") will be one of the dominant alternatives as an exposure apparatus for realizing exposure of such microscopic patterns.

Vacuum ultraviolet radiation beams from, for example, the $F_2$-laser, are difficult to transmit through air. Therefore, the overall light path thereof must be enclosed in a chamber or the like, and the air in the chamber must be replaced by inert gas such as nitrogen or helium, so as to remove the air from the section through which the light path is to be formed. That is, in an exposure apparatus using a vacuum ultraviolet light source, the reticle stage and the wafer stage are enclosed in respective chambers.

Similarly, in an EB-exposure apparatus, the wafer stage and the like are enclosed in evacuated chambers.

In an exposure apparatus using a near-ultraviolet light source such as an ArF-excimer laser, at least one part of the light path is preferably enclosed in a chamber or the like. The chamber or the like is preferably purged by replacing the air therein with clean air from which organic substances and the like have been removed, or with an inert gas such as nitrogen or helium.

However, in these exposure apparatus provided with chambers for enclosing the light paths, it is difficult to use the technology as it is, which is disclosed in, for example, U.S. Pat. No. 5,528,118 described above, to discharge the reaction force caused by driving, for example, wafer stages.

SUMMARY OF THE INVENTION

Accordingly, it is a first object of the invention to provide a stage device in which a reaction force generated by driving a stage can be discharged to the outside while maintaining the stage in a predetermined gas atmosphere condition.

It is a second object of the invention to provide an exposure apparatus in which the accuracy of exposure can be improved.

According to a first aspect of the invention, a stage device includes a stage, an airtight chamber, a driver and a reaction-force-discharging structure. The stage supports an object such as, e.g., a mask or a substrate. The airtight chamber receives the stage in a hermetic state. The driver is disposed in the airtight chamber and includes a movable member connected to the stage and a stationary member that cooperates with the movable member to generate a driving force to drive the stage. The reaction-force-discharging structure discharges a reaction force that is applied to the stationary member when driving the stage to the outside of the airtight chamber via a transmitting member, at least part of the transmitting member being connected to the airtight chamber.

In the present specification, the phrase "cooperates" as used, for example, in "a stationary member that cooperates with the movable member to generate a driving force" means that a driving force is generated by an interaction such as an electromagnetic (or magnetic) interaction between the stationary member and the movable member.

In the stage device according to this aspect of the invention, when the stage is driven by the driver disposed in the airtight chamber, a reaction force is generated by that driving and is applied to the stationary member. The reaction force is discharged to the outside of the airtight chamber by the reaction-force-discharging structure via the transmitting member, at least a portion of which is connected to the airtight chamber. When the airtight chamber receiving the stage is set to a predetermined gas atmosphere (including air from which organic substances and the like have been removed), the reaction force caused by driving the stage can be discharged to the outside while maintaining the predetermined atmosphere.

In this case, the airtight chamber may receive the stage and the driver, and the airtight chamber may be formed by a chamber partition, part of which is provided with an aperture. One end of a hollow resilient sealing member can be connected to a periphery of the aperture of the chamber partition. The other end of the sealing member can be provided with a closing member for closing an opening on that other end. The reaction-force-discharging structure may include a connecting structure, at least one part of which is inserted into an inner space of the sealing member. The connecting structure includes a vibration-damper connected to the closing member, and that connects the stationary member and the transmitting member to each other.

The closing member may be disposed outside the chamber or it may be disposed inside the chamber. In the former case, the vibration-damper may connect the stationary member and the closing member disposed outside the chamber, and the closing member may be connected to the transmitting member. In the latter case, the connecting structure may further include a mounting member to be mounted on the transmitting member. The closing member may be disposed in the chamber, one side thereof being connected to the stationary member. The vibration-damper may connect the other side of the closing member and the mounting member. In the latter case, since the connecting member is disposed inside the chamber, the internal cubic dimensions and the distance between the chamber and the transmitting member can be reduced compared with the former case, whereby the footprint of the device can be reduced.

In the stage device according to the first aspect of the invention, when the reaction-force-discharging structure includes the vibration-damper and the connecting structure for connecting the stationary member and the transmitting member, the vibration-damper may be pivotal along a plane perpendicular to the axis thereof and along two axes perpendicular to each other. When a force caused by a reaction force is applied along the plane perpendicular to the axis of the vibration-damper, the force is absorbed by pivoting motion of the vibration-damper. When the force is applied along the axis of the vibration-damper, the force is efficiently damped by the damping function of the vibration-damper.

Although in the stage device according to the first aspect of the invention, the vibration-damper may be configured in any manner as long as the reaction force by driving the stage can be damped, the vibration-damper is preferably a shock absorber having the functions of a damper and a resilient member.

When the airtight chamber is formed by the chamber partition, the hollow sealing member, and the closing member, the stage device according to the first aspect of the invention may further include an external frame dynamically isolated from the chamber partition and mounted with the transmitting member. The reaction force caused by driving the stage and that is applied to the stationary member is transmitted to the external frame via the transmitting member, at least part of which is connected to the airtight chamber. Since the external frame is dynamically isolated from the chamber, vibration caused by the reaction force transmitted to the external frame is substantially suppressed to zero.

The transmitting member may be mounted on the external frame via a threaded part so as to be movable toward and away from the connecting structure, and the transmitting member and a particular member, which is disposed opposite to the stationary member, among the components of the connecting structure, may be fixed to each other via a fixing structure. The chamber partition mounted with the connecting structure is disposed at a predetermined position, is moved by the threaded part to another position in which the transmitting member comes into contact with the particular member constituting the connecting structure, and the particular member and the transmitting member are fixed to each other by the fixing structure, whereby the assembly is easily completed. As described above, the chamber partition and the connecting structure may be assembled in advance as a unit.

The fixing structure may be a bolt having a thread to mate with a threaded hole formed in at least one of the particular member and the transmitting member, for fastening the particular member and the transmitting member to each other. The fixing structure may be a structure for holding the particular member by a movement of the transmitting member toward the connecting member.

The stage device according to the first aspect of the invention may further include a conveying system for loading and unloading the material to and from the airtight chamber. In this case, loading of the material to the stage in the airtight chamber and unloading of the material from the stage can be performed.

According to a second aspect of the invention, a stage device includes a plurality of stages, each stage supporting an object; an airtight chamber that receives the plurality of stages in a hermetic state; a driver disposed in the airtight chamber and including a movable member connected to each of the plurality of stages and a stationary member associated with each movable member to generate a driving force to drive each of the plurality of stages in cooperation with the movable member; and a reaction-force-discharging structure to discharge a reaction force applied to the corresponding stationary member by driving of at least one of the plurality of stages to the outside of the airtight chamber via a transmitting member, at least a part of which is connected to the airtight chamber.

When one of the stages is driven by the driver disposed in the airtight chamber, a reaction force generated by driving of the stage is applied to the stationary member. The reaction force is discharged to the outside of the airtight chamber by the reaction-force-discharging structure via the transmitting member. When the airtight chamber receiving the plurality of stages is set to a predetermined gas atmosphere (including air from which organic substances and the like have been removed), the reaction force can be discharged to the outside while maintaining the predetermined atmosphere.

According to a third aspect of the invention, an exposure apparatus for exposing a substrate to energy beams, thereby forming a predetermined pattern on the substrate, includes a substrate stage to support the substrate. It also includes an airtight chamber that receives the substrate in a hermetic state. In addition, a driver is disposed in the airtight chamber and includes a movable member connected to the substrate stage and a stationary member that generates a driving force to drive the substrate stage in cooperation with the movable member. It also includes a reaction-force-discharging structure that discharges a reaction force that is applied to the stationary member when the driver drives the substrate stage to the outside of the airtight chamber via a transmitting member, at least a part of which is connected to the airtight chamber.

When the substrate stage is driven by the driver disposed in the airtight chamber, a reaction force is generated by driving the substrate stage and is applied to the stationary member. The reaction force can be discharged to the outside of the airtight chamber by the reaction-force-discharging structure via the transmitting member. When the airtight chamber is set to a predetermined gas atmosphere (including air from which organic substances and the like have been removed), the reaction force caused by driving the substrate stage can be discharged to the outside while maintaining the predetermined atmosphere. For example, by setting the airtight chamber to an atmosphere of an inert gas such as nitrogen and by exposing a substrate to vacuum ultraviolet radiation beams, accurate exposure is possible. In this case, since the reaction force caused by driving the substrate stage does not significantly affect the control of position of the stage, accurate control of the position of the stage is possible, whereby the exposure operation is improved such that variations in position of the transferred patterns do not occur.

Alternatively, for example, the airtight chamber may be evacuated, and electron beams as energy beams may be used for the exposure of the substrate, whereby an improved exposure is also made possible.

The exposure apparatus according to the invention may further include a laser interferometer that determines the position of the substrate stage by measuring the length of beams of which at least one part of the light path is disposed in the airtight chamber. In this case, when the airtight chamber is set to an atmosphere of an inert gas such as nitrogen (or is evacuated), the shimmering by air which causes variations in the measurement by the laser interferometer can be avoided, because the atmosphere in the airtight chamber can be maintained. Thus, an accurate determination of the position of the wafer stage is made possible.

The exposure apparatus according to the invention may further include a projection optical system for applying the energy beams to the substrate. In this case, for example, the airtight chamber is set to an atmosphere of an inert gas such as nitrogen, and the exposure of the substrate is performed by using vacuum ultraviolet radiation beams, whereby exposure with high resolution is possible.

The exposure apparatus according to the invention may further include a chamber in addition to the airtight chamber for receiving the projection optical system.

According to a fourth aspect of the invention, an exposure apparatus for applying energy beams to a mask, thereby transferring a pattern of the mask to the substrate, includes a mask stage for supporting the mask. It also includes a mask chamber that receives the mask stage in a hermetic state. In addition, a mask-driver is disposed in the mask chamber and includes a movable member connected to the mask stage and a stationary member that generates a driving force to drive the mask stage in cooperation with the movable member. The device also includes a reaction-force-discharging structure that discharges a reaction force applied to the stationary member when the driver drives the mask stage to the outside of the mask chamber via a transmitting member, at least a part of which is connected to the mask chamber.

When the mask stage is driven by the driver disposed in the airtight chamber, a reaction force generated by driving the mask stage is applied to the stationary member. The reaction force is discharged to the outside of the airtight chamber by the reaction-force-discharging structure via the transmitting member connected to the airtight chamber. When the airtight chamber receiving the mask stage is set to a predetermined gas atmosphere (including air from which organic substances and the like have been removed), the reaction force caused by driving the mask stage can be discharged to the outside while maintaining the predetermined atmosphere. Therefore, accurate exposure is made possible by setting the airtight chamber to an atmosphere of an inert gas such as nitrogen, and by transferring the pattern of the mask to the substrate by using vacuum ultraviolet radiation beams.

According to a fifth aspect of the invention, a method for manufacturing an exposure apparatus for exposing a substrate to energy beams, thereby forming a predetermined pattern on a substrate, includes the steps of providing a substrate stage for supporting the substrate; closing an airtight chamber in a hermetic state, the airtight chamber receiving a driver, together with the substrate stage, including a movable member connected to the substrate stage and a stationary member for generating a driving force for driving the substrate stage in cooperation with the movable member; and providing a reaction-force-discharging structure for discharging a reaction force applied to the stationary member when the driver drives the substrate stage to the outside of the airtight chamber via a transmitting member, at least a part of which is connected to the airtight chamber.

The substrate stage for supporting a substrate is provided, and the driver is received in the airtight chamber in a hermetic state together with the substrate stage. The driver includes the movable member connected to the substrate stage and the stationary member for generating a driving force to drive the substrate stage in cooperation with the movable member. The reaction-force-discharging structure is provided, for discharging the reaction force generated by driving the substrate stage to the outside of the airtight chamber via the transmitting member. Then, the driver, the substrate stage, the reaction-force-discharging structure, and various other components, such as an illumination optical system, are mechanically, optically, and electrically assembled and adjusted, whereby the exposure apparatus according to an aspect of the invention is manufactured.

BRIEF DESCRIPTION OF THE DRAWINGS

The invention will be described in conjunction with the following drawings in which like reference numerals designate like elements and wherein.

DETAILED DESCRIPTION OF THE PREFERRED EMBODIMENTS (First Embodiment)

Figure 1:
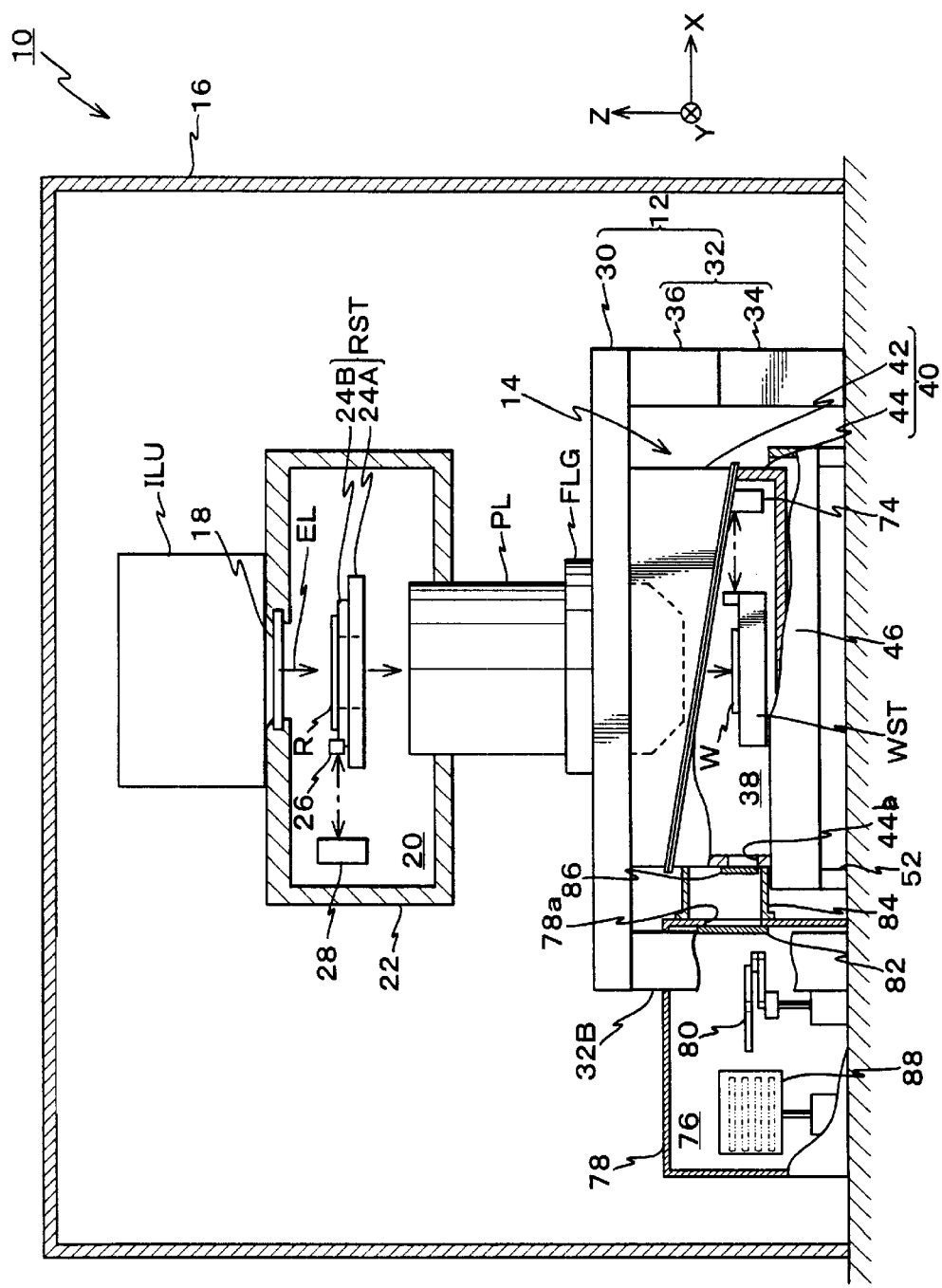
FIG. 1 is a schematic view of an exposure apparatus according to a first embodiment of the invention.

A first embodiment according to the invention is described below with reference to FIGS. 1 to 4 and FIGS. 5A and 5B. FIG. 1 is a schematic view of an exposure apparatus provided with a stage device according to the first embodiment of the invention. An exposure apparatus 10 shown in FIG. 1 is a step-and-scan-type projection exposure apparatus, that is, a scanning stepper in which exposure light EL of vacuum ultraviolet radiation beams is applied to a reticle R (a mask), and the reticle R and a wafer W (a substrate) are relatively scanned in a scanning direction (in this case, in the X-axis direction). This operation causes a pattern of the reticle R to be transferred onto the wafer W via a projection optical system PL.

The exposure apparatus 10 is provided with a light source and an illumination unit ILU as an energy beam (irradiation) source, an illumination system for illuminating the reticle R with the energy beam EL for exposure (hereinafter referred to as "exposure light"). The apparatus also includes a reticle stage RST (a mask stage) for supporting the reticle R and the projection optical system PL for projecting the exposure light EL emitted from the reticle R onto the wafer W. The apparatus further includes a main body column 12 for supporting the projection optical system PL, and a stage device 14 including a wafer stage WST (a substrate stage) for supporting the wafer W. A main body of the exposure apparatus including the above-described components except the light source is disposed in an environmental chamber 16 in which environmental conditions, such as temperature and humidity, are maintained substantially constant.

The light source is disposed in a room (service room) separated from a clean room in which the exposure apparatus 10 is disposed, or in a utility space or the like under the floor of the clean room. The light source is connected to the illumination unit ILU through a light transmitting optical system (not shown). A light source for generating vacuum ultraviolet radiation beams having wavelengths ranging from substantially 120 nm to 180 nm is used. The light source can be, for example, a fluorine laser ($F_2$-laser) having an output wavelength of 157 nm, a krypton dimer laser ($Kr_2$-laser) having an output wavelength of 146 nm, and an argon dimer laser ($Ar_2$-laser) having an output wavelength of 126 nm. An ArF-excimer laser having a wavelength of 193 nm or the like may also be used as the light source.

The illumination unit ILU is configured with an illumination-system housing including therein mirrors disposed in a predetermined relative position for changing the direction of the light path, an optical integrator such as fly-eye lenses, a relay lens system, and a reticle blind as a visual field diaphragm. The illumination unit ILU illuminates a specified illumination region on the reticle R at an even luminous-flux-density distribution with the exposure light EL through a light-transmitting window 18 described below. The illumination region has a slit or rectangular shape linearly extending on the reticle R in the Y-axis direction (in the direction perpendicular to the plane of the drawing). An illumination unit similar to the illumination unit ILU is disclosed in, for example, U.S. Pat. No. 5,473,410, the disclosure of which is incorporated herein by reference in its entirety.

When light beams having a wavelength in the vacuum ultraviolet region are used as exposure light, gases highly absorptive of the light beams of the wavelength band in the vacuum ultraviolet region, such as hydrogen, water vapor, and hydrocarbon-based gases, (hereinafter referred to as an "absorptive gas") must be removed from the light paths. Therefore, according to the present embodiment, a high purity specific gas, which does not absorb vacuum ultraviolet radiation beams, such as nitrogen, helium, argon, neon, or krypton, or mixtures thereof (hereinafter referred to as a "low-absorptive gas") is kept flowing by a gas-supply system (not shown). The concentration of impurities, such as the absorptive gas and organic contaminants, in the low-absorptive gas is not higher than 1 ppm in the illumination-system housing.

The reticle stage RST and the reticle R supported thereby are disposed in a reticle chamber 20. The reticle chamber 20 is defined by a partition wall 22 hermetically connected with the illumination-system housing and a body tube of the projection optical system PL, thereby separating the gas therein from the outside. The partition wall 22 of the reticle chamber 20 is made of a low degasification material such as a stainless steel (SUS).

A low-absorptive gas having a purity slightly lower than that of the low-absorptive gas in the illumination-system housing is kept flowing in the reticle chamber 20 by a gas-supply system (not shown). This is because the low-absorptive gas must be disposed in the vicinity of the reticle R so as to avoid absorption, by an absorptive gas such as oxygen, of the exposure light beams used in the exposure apparatus using a wavelength in the vacuum ultraviolet region. The concentration of impurities, such as the absorptive gas and organic contaminants, in the low-absorptive gas is not higher than several ppm in the illumination-system housing.

A rectangular aperture one size smaller than the reticle R is formed in the ceiling of the partition wall 22 of the reticle chamber 20. The light-transmitting window 18 is disposed in this aperture separating the inner space of the illumination-system housing and the reticle chamber 20 from each other. Since the lighttransmitting window 18 is disposed in a light path of the exposure light EL applied by the illumination unit ILU to the reticle R, the light-transmitting window 18 is made of a crystal material, such as fluorite, having high transmissivity of the vacuum ultraviolet light exposure beams.

The reticle stage RST drives the reticle R on a reticle base-plate (not shown) in large strokes in a linear direction along the X-axis (in the horizontal direction in the drawing), which is a scanning direction during scanning exposure. The reticle stage RST can finely drive the reticle R in the Y-axis direction and in the θz direction (rotational direction around the Z-axis).

In more detail, the reticle stage RST includes a reticle-scanning stage 24A to be driven on a reticle base-plate (not shown) along the X-axis in a predetermined stroke by a reticle driving system such as a linear motor (not shown), and a reticle holder 24B mounted on the reticle-scanning stage 24A for supporting the reticle R by attracting the reticle R with vacuum, for example. The reticle holder 24B can be finely driven (including rotation) along the XY-plane by the reticle driving system.

Although it is not shown in the drawings, a reaction-force-discharging structure, which uses the law of conservation of momentum, is used in the reticle stage system according to the present embodiment, which is disclosed in, for example, U.S. patent application Ser. No. 09/260,544. The disclosure of U.S. patent application Ser. No. 09/260,544 is incorporated herein by reference in its entirety.

The reticle holder 24B is provided with a movable mirror 26 fixed thereto (or formed thereon). The XY-position of the reticle stage RST is continuously determined by a reticle laser-interferometer 28 (hereinafter referred to as "reticle interferometer") via the movable mirror 26 at a predetermined resolution of, for example, 0.5 to 1 nm. The movable mirror 26 on the reticle holder 24B includes an X-movable-mirror and a Y-movable-mirror. The reticle interferometer 28 includes an interferometer for determining the X-position and another interferometer for determining the Y-position, which cooperate with the X-movable-mirror and the Y-movable-mirror, respectively. At least one of the two interferometers is a multiple beam-axis interferometer for measuring the lengths of more than two beam axes, thereby determining the θz-rotation of the reticle stage RST. Although two movable mirrors and two reticle interferometers are provided for determining the X-position and the Y-position, as described above, the movable mirror 26 and the reticle interferometer 28 are shown in FIG. 1 as a single movable mirror and as a single reticle interferometer, for simplicity. In the following description, the position (X, Y, θz) of the reticle stage RST is determined by the reticle interferometer 28.

The reticle interferometer 28 supplies measured values (determined values) to a main control device, which is not shown. The main control device controls the position of the reticle stage RST via a reticle driving system (not shown) in accordance with the determined values from the reticle interferometer 28.

In order to avoid effects of degassing also from detectors and the like which constitute the reticle interferometer 28, the reticle chamber 20 may be provided with a light-transmitting window in the partition wall 22 thereof so that the position of the reticle stage RST can be determined by a reticle interferometer disposed outside the reticle chamber 20 through the light-transmitting window. The light-transmitting window can be formed by mounting a light-transmitting member such as a common optical glass for closing a window section (opening) formed in the partition wall 22. A portion, at which the light-transmitting member constituting the light-transmitting window is mounted, is preferably sealed by a metallic seal made of a material such as indium or copper, or with a fluorocarbon resin.

The projection optical system PL is configured with a body tube (barrel) hermetically containing therein lenses made of fluoride crystals such as fluorite or a lithium fluoride, and an optical system including reflecting mirrors. According to the present embodiment, a reduction optical system having a magnification β of ¼ or ⅕ is used as the projection optical system PL. When the reticle R is illuminated by the exposure light EL from the illumination unit ILU, circuit patterns formed on the reticle R are projected onto shot regions of the wafer W through the projection optical system PL. Thus, reduced images of the circuit patterns are transferred to the wafer and formed thereon.

In the exposure apparatus using exposure light having a wavelength in the vacuum ultraviolet region, according to the present embodiment, the body tube of the projection optical system PL must be filled with a low-absorptive gas so as to avoid absorption of the exposure light, which would occur with an absorptive gas or the like, such as oxygen. Therefore, according to the present embodiment, a high purity low-absorptive gas of the same level as of the low-absorptive gas in the illumination system housing is kept flowing in the body tube of the projection optical system PL by a gas supply system which is not shown. The concentration of impurities, such as the absorptive gas and organic contaminants, in the low-absorptive gas is not higher than 1 ppm in the projection optical system PL.

The main body column 12 includes a rectangular-plate-shaped body-tube base 30 for supporting the projection optical system PL, and four legs 32A, 32B, 32C, and 32D for supporting the body-tube base 30 at the four corners thereof (the legs 32C and 32D disposed at the back side of FIG. 1 are not shown). The body-tube base 30 is provided with a circular aperture formed in a central part thereof. The projection optical system PL is inserted downward into the aperture. The body tube of the projection optical system PL is provided with a flange FLG formed integrally with the body slightly below an intermediate part in the height direction (z-axis direction) of the body tube. The flange FLG is fixed to the body-tube base 30 by screws or the like, thereby fixing the projection optical system PL to the body-tube base 30.

Each of the legs 32A to 32D includes a columnar member 34 fixed to a floor and a vibration-isolation unit 36 disposed in line on the columnar member 34. The effect of vibration of the floor is reduced to a level of $\mu G$ due to the vibration-isolation unit 36 forming each leg, so that the body-tube base 30 and the projection optical system PL are not significantly affected by the vibration.

The stage device 14 includes the wafer stage WST as a stage for supporting the wafer W as a substrate (an object), a driving mechanism (a driver) for driving the wafer stage WST, and the like. The wafer stage WST and the driving mechanism are received hermetically in a wafer chamber 38 which is an airtight chamber.

In the exposure apparatus using exposure light having a wavelength in the vacuum ultraviolet region, the section, in which the light path is disposed, from the projection optical system PL to the wafer W is also filled with the low-absorptive gas so as to avoid absorption of the exposure light by an absorptive gas such as oxygen. Therefore, according to the present embodiment, a low-absorptive gas having the same level of purity as that of the gas in the reticle chamber 20, such as clean helium (He) or dry nitrogen ($N_2$), is kept flowing in the wafer chamber 38 by a gas supply system which is not shown. The concentration of impurities, such as the absorptive gas and organic contaminants, in the low-absorptive gas is not higher than several ppm in the wafer chamber 38.

The wafer chamber 38, the internal structure thereof, and the structure around the wafer chamber 38 are now described further in detail.

A wafer-chamber partition 40 is fixed to the body-tube base 30, which supports the projection optical system PL, in a state hanging from the lower surface of the body-tube base 30. The wafer-chamber partition 40 constitutes partition walls defining the wafer chamber 38.

Figure 2:
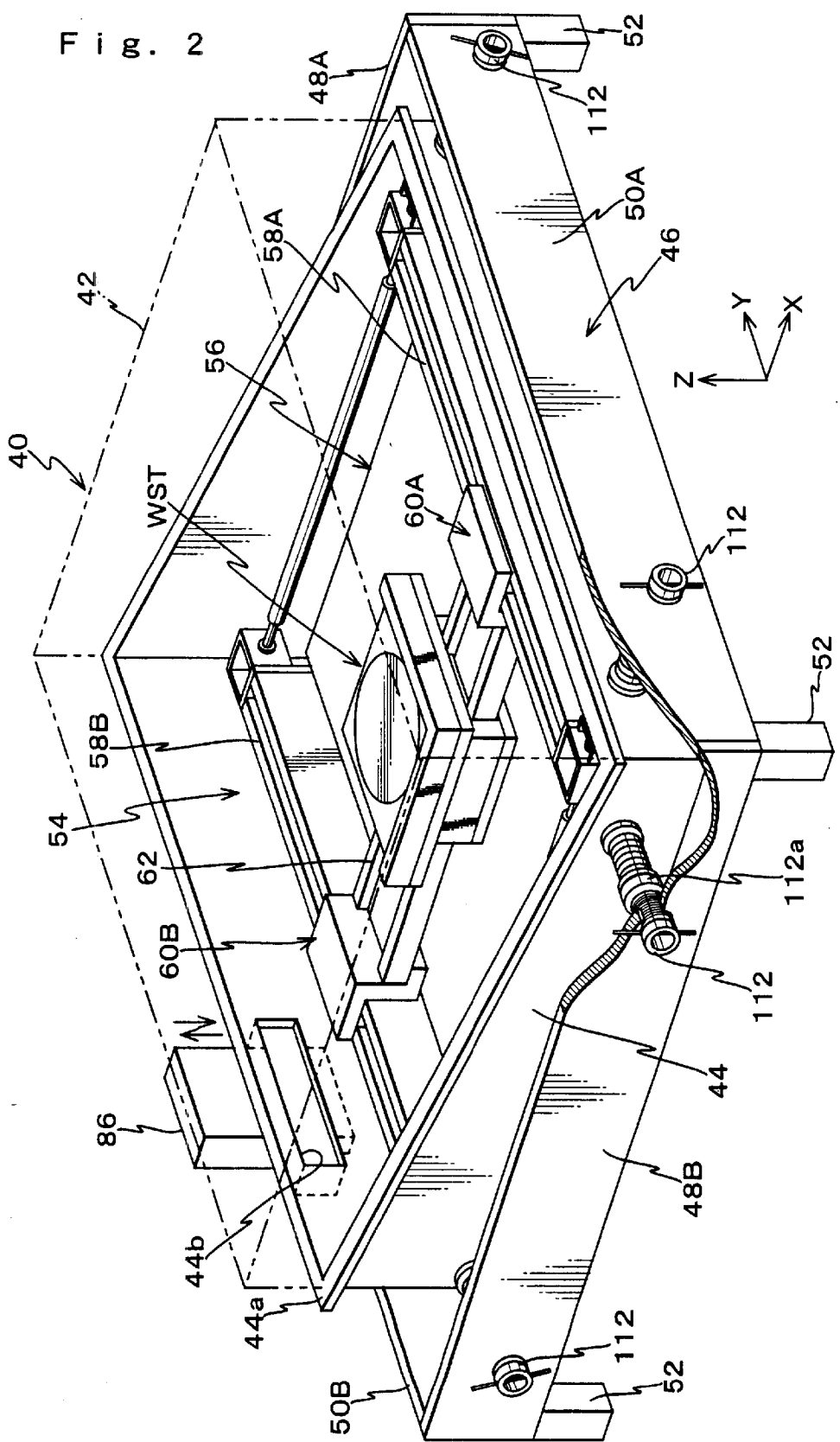
FIG. 2 is an exploded perspective view of a structure in the vicinity of a wafer-chamber partition included in the exposure apparatus shown in FIG. 1.

As shown in FIGS. 1 and 2, the wafer-chamber partition 40 can be divided into an upper-chamber partition 42 and a lower-chamber partition 44 with a separation plane therebetween which is inclined by a predetermined angle with respect to the XY-plane when viewed from a side view toward the +Y side from the −Y side.

The upper part of the upper-chamber partition 42 is fixed to the lower surface of the body-tube base 30. A central part of the upper part of the upper-chamber partition 42 is provided with a circular opening, the circular opening being for receiving therein the lower portion of the body tube of the projection optical system PL. The periphery of the body tube of the projection optical system PL hermetically joins with the circular opening at the inner face of the edge thereof. The upper-chamber partition 42 is provided with a flange integrally formed at the lower part and around the periphery thereof. The lower-chamber partition 44 is provided with a flange 44a integrally formed at the upper part and around the periphery thereof, the flange 44a to be associated with the flange of the upper-chamber partition 42 (see FIG. 2). These flanges are fixed to each other by screws or the like (not shown), whereby the wafer-chamber partition 40 is configured with the upper-chamber partition 42 and the lower-chamber partition 44 assembled as a unit.

A reaction frame 46 is provided around the lower-chamber partition 44. The reaction frame 46 has a rectangular frame-shape in top view. As shown in FIG. 2, the reaction frame 46 includes a pair of X-axis plates 48A and 48B and a pair of Y-axis plates 50A and 50B. The X-axis plates 48A and 48B extend in the X-axis direction, and are spaced from each other by a given distance in the Y-axis direction, and occupy XZ-planes perpendicular to the Y-axis. The Y-axis plates 50A and 50B are disposed so as to connect the longitudinal ends of the X-axis plates 48A and 48B, respectively. The pair of Y-axis plates 50A and 50B extend in the Y-axis direction, are spaced from each other by a given distance in the X-axis direction, and occupy YZ-planes perpendicular to the X-axis.

Legs 52 are provided at four corners of the reaction frame 46. Lower ends of the four legs 52 are fixed to the floor. The vibration transmitted to the reaction frame 46 is discharged to the floor (ground) through the four legs 52.

As shown in FIG. 2, the lower-chamber partition 44 receives therein the wafer stage WST for supporting the wafer W, a driving mechanism 54 for driving the wafer stage WST, and the like. The driving mechanism 54 includes a stage base 56 disposed at the bottom of the lower-chamber partition 44, and a pair of Y-axis guides 58A and 58B disposed at the ends along the X-axis of the stage base 56 on the upper face thereof and extending along the Y-axis. Driving mechanism 54 also includes a pair of slider units 60A and 60B for moving along the Y-axis guides 58A and 58B in the Y-axis direction, an X-axis guide 62 provided with the slider units 60A and 60B at the longitudinal ends thereof for guiding the wafer stage WST along a plane parallel to the XY-plane and in the X-axis direction, and the like.

Figure 3:
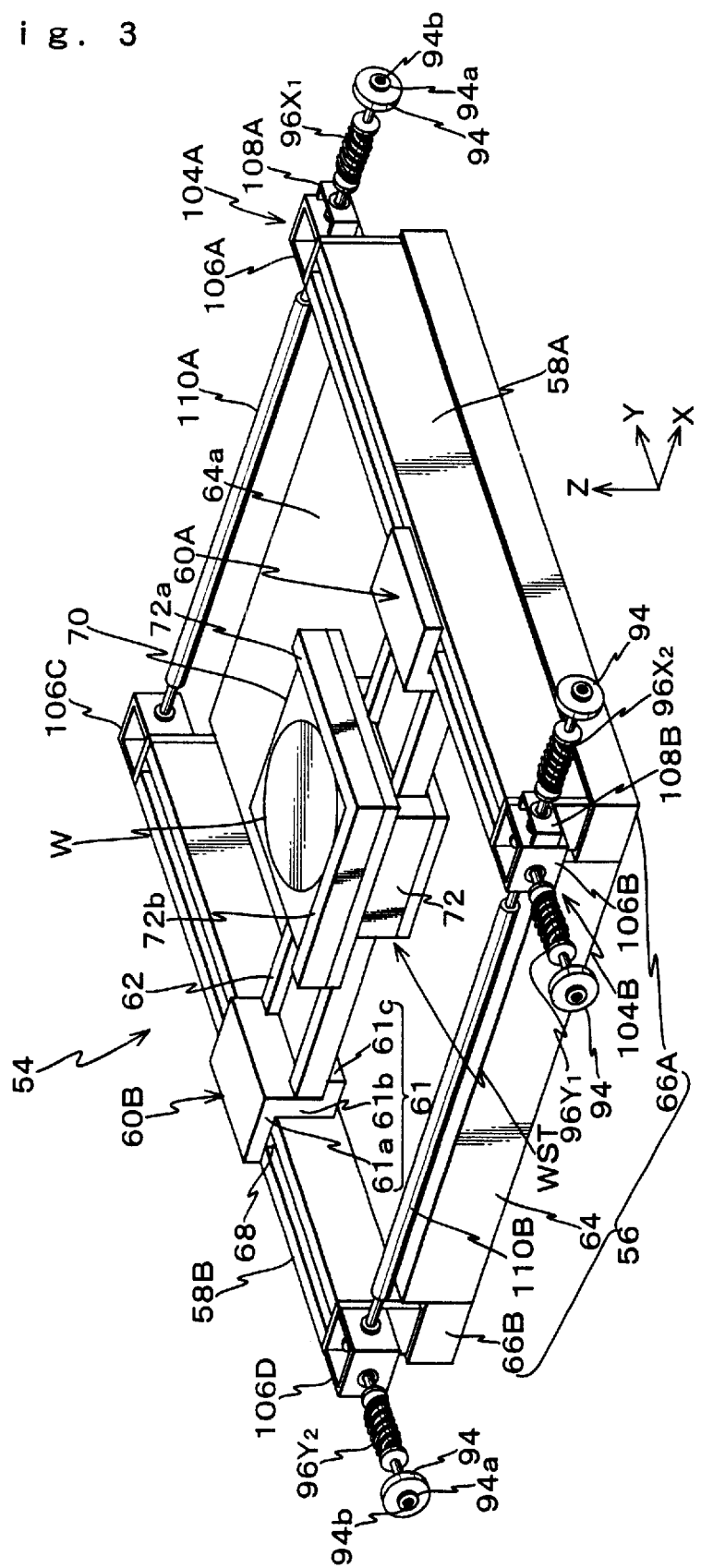
FIG. 3 is a perspective view of a driving mechanism and other mechanisms disposed in the wafer-chamber.

FIG. 3 shows the driving mechanism 54 and the like taken out from the lower-chamber partition 44. As shown in FIG. 3, the whole of the stage base 56 is rectangular in top view. The stage base 56 includes three components: (1) a rectangular plate-shaped surface plate 64 having a given thickness and disposed at an intermediate part in the X-axis direction of the stage base 56, and (2, 3) a pair of guide-plane-forming members 66A and 66B affixed at one end (+X-side) in the X-axis direction of the surface plate 64 and at the other end (−X-side) in the X-axis direction of the surface plate 64, respectively. The guide-plane-forming members 66A and 66B extend along the Y-axis. The upper face of each of the pair of guide-plane-forming members 66A and 66B is set to the same level as of the other and slightly lower than the upper face of the surface plate 64. An upper face 64a of the surface plate 64, which is formed to have a very high degree of flatness, serves as a first Z-guide face for supporting the wafer stage WST in the Z-axis direction in a non-contact fashion. A plurality of gas-static-pressure bearings (not shown) for applying pressurized gas, such as high purity helium gas or dry nitrogen gas, to the first Z-guide face 64a are provided at the bottom of the wafer stage WST. The wafer stage WST is supported so as to float above the first Z-guide face 64a with a given clearance of, for example, several pm from the first Z-guide face 64a.

The upper faces of the pair of guide-plane-forming members 66A and 66B serve as second Z-guide faces having a flatness at a level not higher than that of the first Z-guide face 64a. The Y-axis guides 58A and 58B are supported so as to float in a non-contact fashion above the second Z-guide faces. A plurality of gas-static-pressure bearings (not shown) for applying pressurized gas, such as high purity helium gas or dry nitrogen gas, to the second Z-guide faces are provided at the bottoms of the Y-axis guides 58A and 58B. The Y-axis guides 58A and 58B are supported so as to float above the second Z-guide faces with a given clearance of, for example, several sum from the second Z-guide faces by a static pressure of the pressurized gas applied by the gas-static-pressure bearings to the opposing second Z-guide faces.

Each of the Y-axis guides 58A and 58B includes a yoke extending along the Y-axis in a predetermined length and having a U-shaped XZ-section, and permanent magnets disposed along the Y-axis in the inner face of the yoke at a predetermined pitch. In this case, an alternating magnetic field is formed in the inner space of each yoke along the Y-axis.

As shown in FIG. 3, the slider unit 60B is provided with a slider 61 including an upper horizontal part 61a opposing the upper face of the Y-axis guide 58B, a vertical part 61b opposing the inner face of the is guide 58B, and a lower horizontal part 61c extending from the vertical part 61b in a direction opposite to the upper horizontal part 61a, and a coil unit 68 protruding from the lower face of the upper horizontal part 61a of the slider 61. The slider 61 is formed in a manner such that a rectangular plate having a given thickness is bent along two lines parallel to a line perpendicular to the longitudinal direction of the plate, with a longitudinally intermediate part therebetween, the longitudinal ends of the rectangular plate extending at an angle of 90 degrees with respect to the longitudinally intermediate part and in the opposite directions to each other. The slider 61 is fixed to the end of the −X side of the X-axis guide 62 at the upper face of the lower horizontal part 61c of the slider 61 and at a face of the +X side of the vertical part 61b of the slider 61.

The coil unit 68 is provided therein with a plurality of armature coils disposed at a predetermined pitch along the Y-axis.

The other slider unit 60A is formed symmetrically with respect to the slider unit 60B.

The slider unit 60B is provided at the −X side thereof with a plurality of gas-static-pressure bearings (not shown) for applying a pressurized gas, such as high purity helium gas or dry nitrogen gas, to a side face of the Y-axis guide 58B. In the same manner, the slider unit 60A is provided at the +X side thereof with a plurality of gas-static-pressure bearings (not shown) for applying a pressurized gas, such as high purity helium gas or dry nitrogen gas, to a side face of the Y-axis guide 58A. Due to the static pressure generated by the pressurized gas discharged by the gas-static-pressure bearings, the slider units 60B and 60A are supported in a non-contact state with the opposing Y-axis guides. The gaps between the slider unit 60B and the Y-axis guide 58B and between the slider unit 60A and the Y-axis guide 58A are monitored by a gap sensor, which is not shown. The discharging pressure of the pressurized gas from the gas-static-pressure bearings provided in the slider units 60B and 60A is fed back and controlled by a main control device, which is not shown, in accordance with the outputs from the gap sensor so that the gaps are maintained substantially constant.

According to the present embodiment, as is clear from the description above, the Y-axis guide 58B serves as a stator (a stationary member) of a moving-coil-type linear motor (one Y-linear motor), and the slider unit 60B serves as a movable member of the linear motor. In the same fashion, the Y-axis guide 58A serves as a stator (a stationary member) of another moving-coil-type linear motor (another Y-linear motor), and the slider unit 60A serves as a movable member of the linear motor.

Each slider 61 included in the slider unit 60A or 60B is provided at the lower face thereof with a plurality of gas-static-pressure bearings (not shown) for applying a pressurized gas, such as high purity helium or dry nitrogen gas, to the first Z-guide face 64a. Due to the static pressure generated by the pressurized gas discharged by the gas-static-pressure bearings to the first Z-guide face 64a, the X-axis guide 62 provided with the slider units 60B and 60A at the ends thereof is supported over the first Z-guide face 64a in a non-contact state with respect to the first Z-guide face 64a with a given clearance therefrom.

In FIG. 3, the wafer stage WST includes a substrate table 70 for supporting the wafer W, and a stage 72 for supporting the substrate table 70 via a Z-tilt-driving mechanism which is not shown.

The X-axis guide 62 is provided with armature coils disposed along the X-axis at a predetermined pitch. The stage 72 is provided with a plurality of permanent magnets disposed along the X-axis at a predetermined pitch, corresponding to the armature coils. According to the present embodiment, the X-axis guide 62 serves as an armature unit as a stator (stationary member) of a moving-magnet-type X-linear motor, and the stage 72 serves as a magnetic pole member as a movable unit of the X-linear motor.

In FIG. 3, the substrate table 70 is provided thereon with an X-movable mirror 72a at an end along the X-axis (at the +X end) extending in the Y-axis direction, and a Y-movable mirror 72b at an end along the Y-axis (at the −Y end) extending in the X-axis direction. The wafer W is fixed to the upper face of the substrate table 70 by an electrostatic attraction or a vacuum absorption via a wafer holder, which is not shown.

The outer surfaces of the movable mirrors 72a and 72b disposed on the wafer stage WST (more particularly on the substrate table 70) are reflective surfaces which are mirror-finished. Interferometer-beams of which the lengths of the axes are to be measured are applied by each of a plurality of interferometers constituting an interferometer system 74 shown in FIG. 1 to the reflective surfaces of the movable mirrors 72a and 72b. The reflected beams are received by the interferometers corresponding to the lengths of the beam axes, thereby determining the displacement of each reflective surface from a reference position (generally, a fixed mirror, of which the surface is set to be a reference surface, is disposed at a side of the projection optical system PL or an alignment optical system (not shown)), and thereby determining a two-dimensional position of the wafer stage WST.

In order to avoid effects of degassing from detectors and the like of the interferometers constituting the interferometer system 74, the wafer chamber partition 40 may be provided therein with a light-transmitting window in the same manner as in the reticle chamber so that the position of the wafer stage WST can be determined by the interferometers disposed outside the wafer chamber 40 through the light-transmitting window.

A wafer-loader-chamber partition 78 for defining a wafer loader chamber 76 is disposed at the −X side of the wafer-chamber partition 42 for defining the wafer chamber 38 (to the left in FIG. 1) and at an intermediate part in the Y-axis direction (direction perpendicular to the plane of FIG. 1) toward the −Y side (forward in FIG. 1).

A wafer loader 80 including a multi-articulated robot is disposed in the wafer loader chamber 76. An opening 78a is formed at a given level in a wall at the +X side of the. wafer-loader-chamber partition 78. The opening 78a opens and closes by vertically (in the Z-axis direction) sliding a sliding door 82.

A connecting part 84 is provided outside the wafer loader chamber 76 at the opening 78a. The wafer loader chamber 76 communicates with a wafer-loading-and-unloading port 44b formed in a side wall at the −X side of the lower-chamber partition 44 through the connecting part 84. The wafer-loading-and-unloading port 44b can open and close by vertically (in the Z-axis direction) sliding a sliding door 86. However, since the sliding door 82 is provided, the sliding door 86 may be generally open.

As shown in FIG. 1, a wafer carrier 88 is disposed in the wafer loader chamber 76, for receiving and storing a plurality of wafers. The wafers are loaded and unloaded by the wafer loader 80 between the wafer carrier 88 and the wafer stage WST disposed in a given loading position.

The wafer loader chamber 76 is filled with helium gas or dry nitrogen gas. The purity of the helium gas or the like in the wafer loader chamber 76 is set slightly lower than that of the gas in the wafer chamber 38.

In the exposure apparatus 10 according to the present embodiment, during the stepping between each shot, the alignment, or the like, the driving force (electromagnetic force) generated by the pair of Y-linear motors along the Y-axis direction drives the wafer stage WST. and the X-axis guide 62 as a unit along the Y-axis. This generates a reaction force, thereby moving the Y-axis guides 58A and 58B, which are the stators of the pair of Y-linear motors, in a direction opposite to that of the wafer stage WST. When the frictional force between the wafer stage WST and the surface plate 64, between the slider 60A and the Y-axis guide 58A, between the slider 58B and the Y-axis guide 58B, between the Y-axis guide 58A and the guide-plane-forming member 66A, and between the Y-axis guide 58B and the guide-planeforming member 66B is substantially zero (or so small as to be negligible), the momentum of a system including these components is conserved. In this case, the reaction force generated by driving the wafer stage WST is absorbed by the movement of the Y-axis guides 58A and 58B, whereby the reaction force does not cause vibration of any component. Since the center of gravity of the system does not move, offset of the load does not occur.

However, the frictional force is not zero. Therefore, according to the present embodiment, a reaction-force-discharging mechanism is provided for suppressing vibration of the wafer-chamber partition 40, the body-tube base 30 mounted with the wafer-chamber partition 40, and the projection optical system PL supported by the body-tube base 30.

When the wafer stage WST is driven by the X-linear motor in the X-axis direction, which is a scanning direction, during a scanning exposure operation, a reaction force of the driving force is applied to the X-axis guide 62 which is a stator of the X-linear motor. The reaction force applied to the X-axis guide 62 is transmitted to one of the sliders 60A and 60B opposite to the direction of movement of the wafer stage WST, and to the Y-axis guide associated with that slider, whereby the Y-axis guide is finely moved in a direction of the reaction force. In this case, since the momentum of the system is not conserved, the stage base 56 vibrates. Therefore, according to the present embodiment, the reaction-force-discharging mechanism is provided for suppressing vibration of the wafer-chamber partition 40, the body-tube base 30 mounted with the wafer-chamber partition 40, and the projection optical system PL supported by the body-tube base 30.

The reaction-force-discharging mechanism is described below with reference to FIGS. 4, 5A, 5B, and 3.

Figure 4:
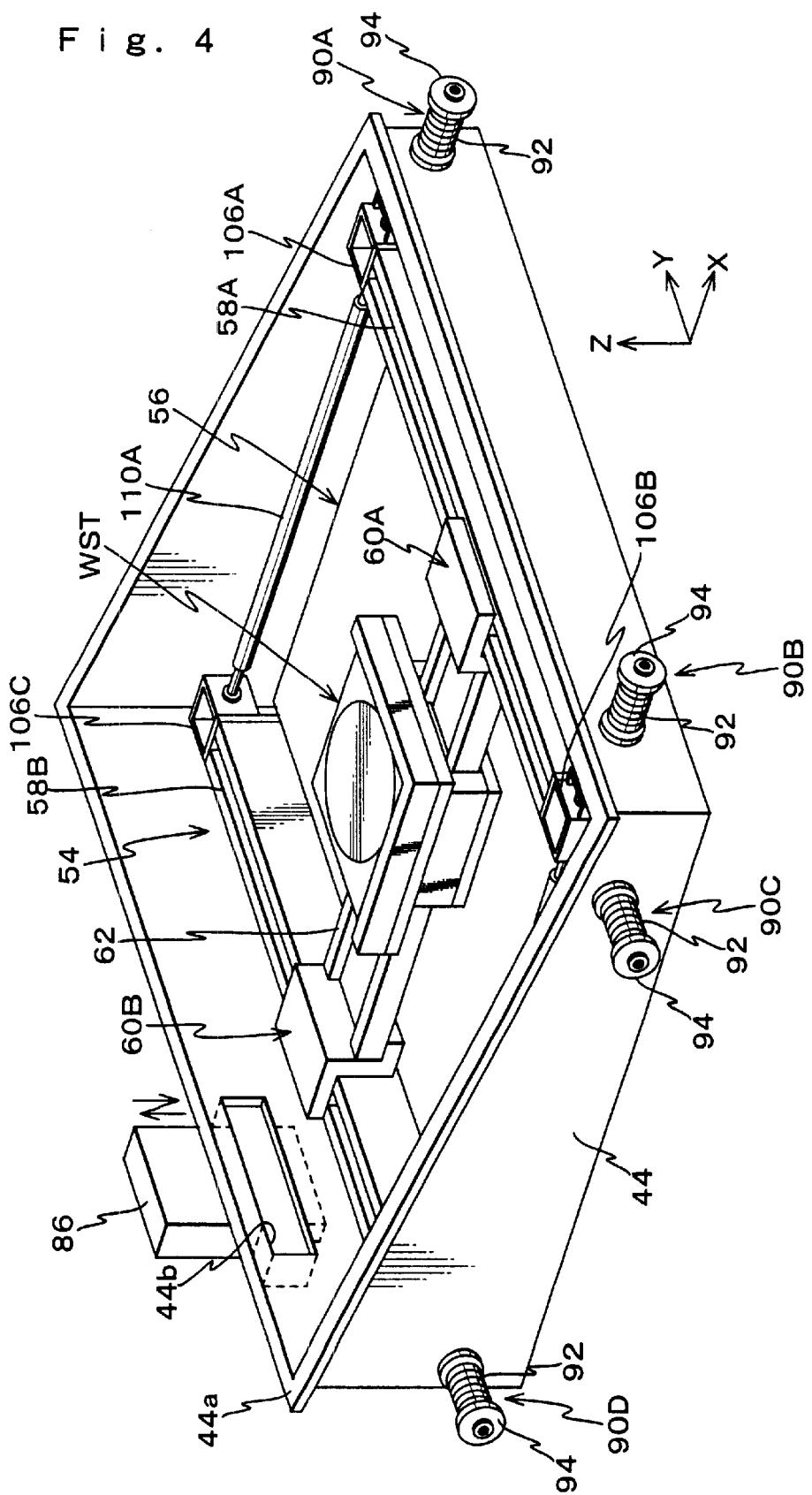
FIG. 4 is a perspective view of a lower-chamber partition constituting the wafer-chamber partition.

In FIG. 4, the lower-chamber partition 44 is provided with connecting units 90A and 90B protruding from a side face at the +X side of the lower-chamber partition 44 at the ends in the Y-axis direction thereof and disposed at the same level as each other. In the same manner, connecting units 90C and 90D are provided protruding from another side face at the −Y side of the lower-chamber partition 44 at the ends in the X-axis direction thereof and disposed at the same level as each other. The connecting units 90A and 90B and the connecting units 90C and 90D are disposed substantially at the same level as each other.

Each of the connecting units 90A to 90D includes an expandable-and-contractible bellows 92, which is a hollow sealing member, connected to the lower-chamber partition 44 at one end of the bellows 92, and a flange 94 mounted at the other end of the bellows 92, which is a closing member for closing an opening at the end of the bellows 92.

Figure 5A:
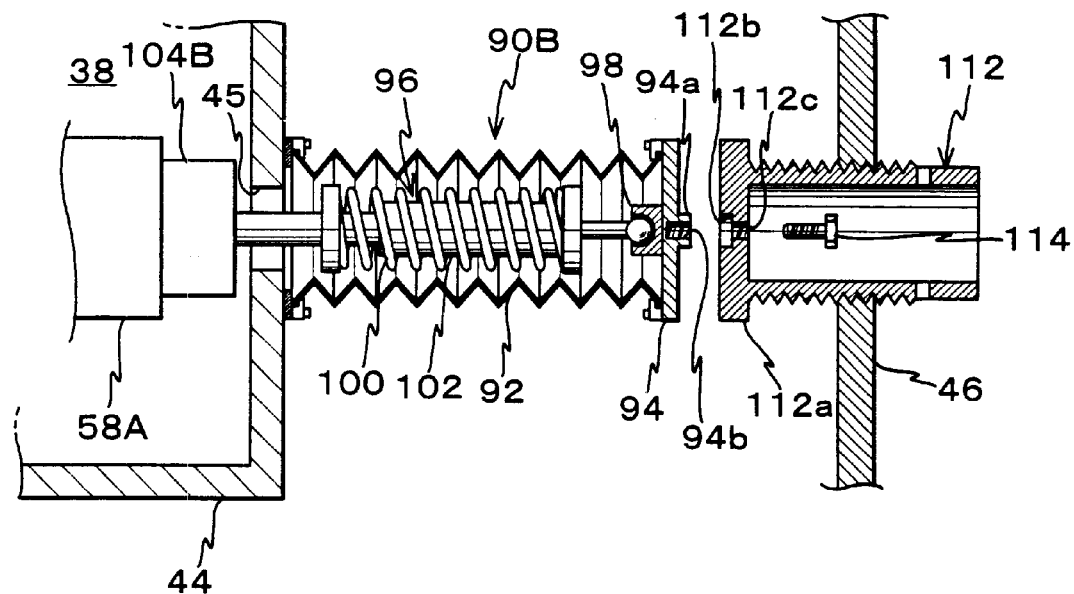
FIG. 5A is an illustration showing the structure in the vicinity of a connecting unit and a transmitting-member constituting a reaction-force-discharging structure.

As shown in FIG. 5A, the bellows 94 constituting each of the connecting units 90A to 90D is hermetically connected at one end thereof to the outer face of an edge around an opening 45 formed in the lower-chamber partition 44, the connecting unit 90B being shown in FIG. 5A. According to the present embodiment, the wafer chamber 38 as an airtight chamber is defined by the wafer-chamber partition 40 (the upper-chamber partition 42 and the lower-chamber partition 44), the bellows 92 and the flanges 94 constituting the connecting units 90A to 90D.

In FIG. 5A, the bellows 92 constituting the connecting unit 90B is provided with a shock absorber (buffer device) 96 as a vibration-damper inserted therein. The shock absorber 96 is connected to the flange 94 at one end (the +X-side end) of the shock absorber 96 via a ball joint 98. The shock absorber 96 is configured with a spring member 100 and a damper, for example, a hydraulic damper 102. The shock absorber 96 is connected at the other end (the −X-side end) thereof to the Y-axis guide 58A via a mounting structure 104B.

The other connecting units 90A, 90C, and 90D have the same configuration and the same internal structure as the connecting unit 90A.

The mounting structure and the like of the shock absorbers on the Y-axis guides are described in further detail. FIG. 3 shows the driving mechanism 54 of the wafer stage WST taken out from the wafer-chamber partition, and also shows the shock absorbers 96 connected to a pair of the Y-axis guides 58A and 58B constituting the driving mechanism 54. That is, FIG. 3 shows the internal structure of the wafer chamber, which is a structure shown in FIG. 4 but without the lower-chamber partition 44 and the bellows 92.

In FIG. 3, a mounting structure 104A and the mounting structure 104B are fixed to respective longitudinal ends of the Y-axis guide 58A. The mounting structure 104A includes a mounting member 106A fixed to an end face of the Y-axis guide 58A at the +Y side thereof, and a gimbals supporting structure 108A fixed to the mounting member 106A at the +X side face thereof for supporting an X-axis shock absorber $96X_1$ at the −X-side end thereof so as to pivot the shock absorber $96X_1$ in the θy direction (pivoting direction around the Y-axis) and in the θz direction (pivoting direction around the Z-axis).

In the same fashion, the mounting structure 104B includes a mounting member 106B fixed to an end face of the Y-axis guide 58A at the −Y side thereof, and a gimbals supporting structure 108B fixed to the mounting member 106B at the +X-side face thereof for supporting a shock absorber $96X_2$ at the other end thereof so as to pivot the shock absorber $96X_2$ in the θy direction and in the θz direction. The mounting member 106B is provided with a circular opening formed at the −Y-side face thereof. An end (the +Y-side end) of a Y-axis shock absorber $96Y_1$ is inserted into the circular opening, and the gimbals supporting structure 108B provided in the mounting member 106B supports the shock absorber $96Y_1$ at the end thereof so as to pivot the shock absorber $96Y_1$ in the θx direction and in the θz direction.

Mounting members 106C and 106D are fixed to the Y-axis guide 58B at the longitudinal ends thereof. Between the mounting member 106C and the above-described mounting member 106A, a shock absorber 110A, which is a hydraulic damper, is disposed connecting the two mounting members along the X-axis.

The other mounting member 106D is provided with a circular opening formed at the −Y-side face thereof. An end (the +Y-side end) of a Y-axis shock absorber $96Y_2$ is inserted into the circular opening, and a gimbals supporting structure provided in the mounting member 106D supports the shock absorber $96Y_2$ at the end thereof so as to pivot the shock absorber $96Y_2$ in the θx direction and in the θz direction. Between the mounting member 106D and the above-described mounting member 106B, a shock absorber 110B, which is a hydraulic damper, is disposed connecting the two mounting members along the X-axis.

The flange 94 constituting each of the connecting units 90A to 90D, shown in FIGS. 3, 5A, and others, is provided with a convex part 94a at the center of an outer face (a face opposite to the shock absorber) of the flange 94. A threaded hole 94b is formed in the center of the convex part 94a. In FIG. 2, transmitting members 112 having a cylindrical shape with a bottom are disposed at positions of the reaction frame 46 opposing the flanges 94. A wall 112a of an end (the end at the side of the flange 96) of each transmitting member 112, which is a bottom wall of the transmitting member 112, is a frame flange. As shown in FIG. 5A, a concave part 112b that mates with the convex part 94a and a threaded hole 112c passing through the concave part 112b at the center thereof are formed at the center of the frame flange 112a.

Each transmitting member 112 is threaded at the outer periphery thereof except for the frame flange 112a part and a part of the end of the transmitting member 112 opposite to the frame flange 112a. Threaded holes to mate with the threaded parts of the transmitting members 112 are formed in the reaction frame 46 at the corresponding positions thereof.

Figure 5B:
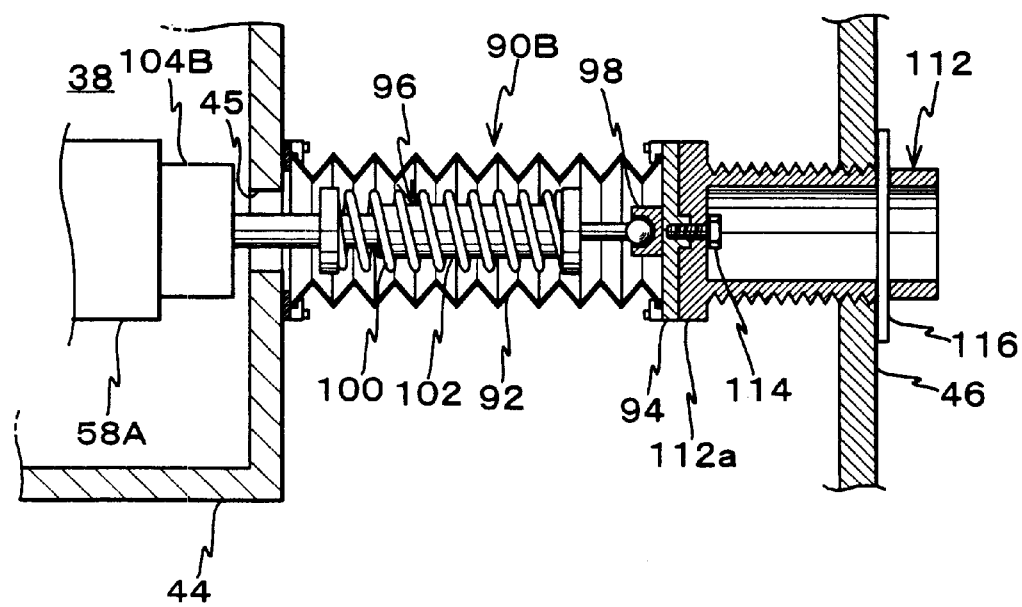
FIG. 5B is an illustration showing a method for fixing the connecting unit and the transmitting member which are shown in FIG. 5A, to each other.

Therefore, when the transmitting member 112 shown in FIG. 5A is rotated by a given amount and in a given direction, the transmitting member 112 moves toward the wafer-chamber partition 40 (the lower-chamber partition 44), then the convex part 94a of the flange 94 mates with the concave part 112b of the frame flange 112a. Next, a bolt 114 as a fixing member is inserted into the opening of the transmitting member 112, as shown in FIG. 5A, is fastened by being coupled with the threaded holes 112c and 94b, thereby fixing the flange 94 and the frame flange 112a to each other, as shown in FIG. 5B. Thus, the Y-axis guides 58A and 58B (in particular, the mounting structures 104A and 104B and the mounting member 106D) and the transmitting members 112 are connected to each other via the shock absorbers 96 and the flanges 94. Finally, the mounting of the wafer-chamber partition 40 on the reaction frame 46 is completed by inserting pins 116 into through-holes formed in the transmitting members 112. FIG. 2 shows the wafer-chamber partition 40 and the reaction frame 46 in an assembled state.

As described above, the exposure apparatus 10 according to the present embodiment includes a connecting structure for connecting the Y-axis guides 58A and 58B to the transmitting members 112, the connecting structure including the mounting structures 104A and 104B, the mounting member 106D, the shock absorbers $96X_1$, $96X_2$, $96Y_1$, and $96Y_2$, the flanges 94, and others. In the exposure apparatus 10 according to the present embodiment, a reaction-force-discharging structure is provided for discharging the reaction force applied to the Y-axis guides 58A and 58B when the wafer stage WST is driven via the transmitting members 112, a part of which is connected to the wafer chamber 38, while maintaining the hermetic state in the wafer chamber 38. The reaction-force-discharging structure includes the connecting structure, the transmitting members 112, and the reaction frame 46.

The exposure operation of the exposure apparatus 10 arranged as described above is described briefly as follows.

A main control device which is not shown, while monitoring measured values of the interferometer system 74 in accordance with the result of alignment performed in advance, controls the Y-linear motors and the X-linear motor constituting the driving mechanism 54 of the wafer stage WST so as to move the wafer stage WST to a scanning-start position for exposure of a first shot on the wafer W.

The main control device starts relative scanning of the reticle R and the wafer W, that is, the reticle stage RST and wafer stage WST in the X-axis direction. When the stages RST and WST are set to move at respective designed speeds in a synchronized state, pattern regions of the reticle R start to be illuminated by ultraviolet pulsed beams from the illumination unit ILU, and a scanning exposure operation starts. The relative scanning is performed by the main control device controlling the linear motors which constitute a reticle driving mechanism and the driving mechanism 54, while the main control device is monitoring measured values from the interferometer system 74 and the reticle interferometer.

During the scanning exposure operation, the main control device controls the reticle stage RST and the wafer stage WST in a synchronized manner such that the ratio of speed, particularly in the X-axis direction, between a movement speed Vr of the reticle stage RST and a movement speed Vw of the wafer stage WST is maintained at a ratio in accordance with the projection magnification (¼ or ⅕) of the projection optical system PL. The control is performed via the linear motors constituting the reticle driving mechanism and the driving mechanism 54.

Other pattern regions on the reticle R are illuminated one after another by ultraviolet pulsed beams, and the illumination of the entire pattern regions is completed, whereby the scanning exposure of the first shot on the wafer W is completed. Thus, the patterns of the reticle R are transferred (while being reduced) to the first shot via the projection optical system PL.

As described above, when the scanning exposure of the first shot is completed, the main control device moves the wafer stage WST in step in the X and Y directions by using the linear motors constituting the driving mechanism 54 to a scanning-start position for exposure of a second shot. In the same manner as described above, the main control device controls the operation of the components so as to perform scanning exposure of the second shot on the wafer W.

In the above-described manner, the scanning exposure of a shot and the stepping for the subsequent shot on the wafer W are repeatedly performed, whereby the patterns of the reticle R are transferred in sequence to all the shot to be exposed on the wafer W.

During the scanning exposure operation, a reaction force is generated by driving the wafer stage WST along the X-axis direction and is applied to the X-axis guide- 62. The reaction force is transferred via one of the sliders 60A and 60B to the opposing X-axis guide. For example, when the wafer stage WST is driven toward the −X side, a reaction force is applied to the X-axis guide toward the +X side. By the reaction force toward the +X side, the Y-axis guide 58A is pressed toward the +X side via the slider 60A. The reaction force toward the +X side is damped by the shock absorbers $96X_1$ and $96X_2$, and the damped force toward the +X side is transmitted to the reaction frame 46 from the shock absorbers $96X_1$ and $96X_2$ via the transmitting members 112.

When the wafer stage WST is driven along the Y-axis direction, a reaction force in the Y-axis direction is applied to the Y-axis guide 58A or 58B, and to the shock absorbers $96Y_1$ and $96Y_2$. The force is damped by the shock absorbers $96Y_1$ and $96Y_2$, and the damped force is transmitted to the reaction frame 46 from the shock absorbers $96Y_1$ and $96Y_2$ via the transmitting members 112.

The forces transmitted to the reaction frame 46 are discharged to the floor (ground) through the four legs 52.

During the stepping operation, a reaction force is generated and applied to the Y-axis guides 58A and 58B toward the +Y side or the −Y side by driving the wafer stage WST along the Y-axis. This causes the Y-axis guides 58A and 58B to move in a direction opposite to that of the wafer stage WST. The reaction force is mostly absorbed by the movement of the Y-axis guides 58A and 58B. The reaction force remaining without being absorbed is transmitted to the shock absorbers $96Y_1$ and $96Y_2$. The reaction force transmitted to the shock absorbers $96Y_1$ and $96Y_2$ is thereby damped, and the damped force is transmitted to the reaction frame 46 from the shock absorbers $96Y_1$ and $96Y_2$ via the transmitting members 112.

The force transmitted to the reaction frame 46 is discharged to the floor (ground) through the four legs 52.

In the cases described above, there is a risk that the force transmitted to the floor can be transmitted back to the legs 32A to 32D of the main body column 12. However, the force transmitted to the floor is very small, and the force transmitted to the legs 32A to 32D is reduced to a level of $\mu$G due to a vibration-isolation unit constituting each leg. Therefore, in conclusion, any effect that a reaction force caused by driving the wafer stage WST has on the body-tube base 30 and on the projection optical system PL is negligible.

The reaction force generated by driving the reticle stage RST is cancelled by the reaction-force-discharging mechanism using the law of conservation of momentum, whereby the effect that the reaction force caused by driving the reticle stage RST has on the projection optical system PL is also negligible.

As described above, in the stage device 14 according to the present embodiment, when the wafer stage WST is driven by the driving mechanism 54 disposed in the wafer chamber 38, a reaction force is generated by the driving of the wafer stage WST and is applied to the X-axis guide (stator of the X-linear motor) or to the Y-axis guide 58A or 58B (stator of the Y-linear motor). In this case, the reaction force is discharged by the above-described reaction-force-discharging mechanism to the outside of the wafer-chamber partition 40 via the transmitting members 112, a part of which is connected to the wafer-chamber partition 40 defining the wafer chamber 38, which is maintained in a hermetic state. Therefore, the reaction force due to driving the wafer stage WST can be discharged to the outside while maintaining the atmosphere of low-absorptive gas in the wafer chamber 38 that receives the wafer stage WST.

In the stage device 14, the reaction-force-discharging mechanism includes the shock absorbers $96X_1$, $96X_2$, $96Y_1$, and $96Y_2$, and the connecting structure which connects the Y-axis guides 58A and 58B and the transmitting members 112. Each of the shock absorbers $96X_1$, $96X_2$, $96Y_1$, and $96Y_2$ can pivot along a plane perpendicular to the axis thereof and along two axes perpendicular to each other. Therefore, when a force is applied along the planes perpendicular to the axes of the shock absorbers $96X_1$, $96X_2$, $96Y_1$, and $96Y_2$, the force is absorbed by pivoting of the shock absorbers $96X_1$, $96X_2$, $96Y_1$, and $96Y_2$. When a force is applied along the axis of the shock absorber $96X_1$, $96X_2$, $96Y_1$, or $96Y_2$, the force can be efficiently damped by the damping function thereof.

The transmitting members 112 are mounted on the reaction frame 46 via threaded parts so as to be movable toward and away from the connecting units 90A to 90D including connecting structures (96, 94). The transmitting members 112 are fixed by the bolts 114 to particular members (the flanges 94 in the above-described embodiment) among the components of the connecting structures disposed opposite to the Y-axis guides 58A and 58B. The wafer-chamber partition 40 mounted with the connecting units 90A to 90D is disposed at a predetermined position, is moved to a position at which the transmitting members 112 come into contact with the flanges 94 by screwing, and the flanges 94 are fixed by the bolts 114 to the frame flanges 112a provided on the transmitting members 112, thereby easily completing the assembly. According to the present embodiment, the lower-chamber partition 44 defining a wafer chamber and the connecting units 90A to 90D are set in advance as a unit, thereby facilitating the assembly as described above. Therefore, manufacturing time can be shortened.

In the exposure apparatus 10 according to the present embodiment, as is easily ascertained from FIG. 1, since high purity helium gas or dry nitrogen gas is disposed along the overall light path of the exposure light EL, the transmissivity of the exposure light (ultraviolet pulsed beam) is prevented from being reduced to the maximum extent, and the amount of exposure light can be accurately controlled. Since a vacuum ultraviolet radiation beam is used as exposure light, an exposure at high resolution is possible by using the projection optical system PL. A high quality exposure without misalignment of transferred patterns is possible by improving the performance of discharging vibration of the devices by discharging a reaction force generated by driving the wafer stage WST via the reaction frame and by using a reaction-force-canceling mechanism at the reticle stage side, which uses the law of conservation of momentum. In this case, the reaction force generated by driving the wafer stage WST does not significantly affect the control of the position of the wafer stage WST, whereby highly accurate position control of the wafer stage WST is possible.

In the exposure apparatus 10, light paths of the beams of which the lengths are measured are formed in the wafer chamber 38, the interferometer system 74 for determining the position of the wafer stage WST is disposed in the wafer chamber 38, and the atmosphere of inert nitrogen or other gas in the wafer chamber 38 can be maintained. Therefore, accurate determination of the position of the wafer stage WST is possible by preventing shimmering by air from being generated by maintaining the atmosphere of inert nitrogen or other gas in the wafer chamber 38, the shimmering by air causing variation in measurement by the laser interferometers for measuring each length of the axis, which constitute the interferometer system 74.

Figure 6A:
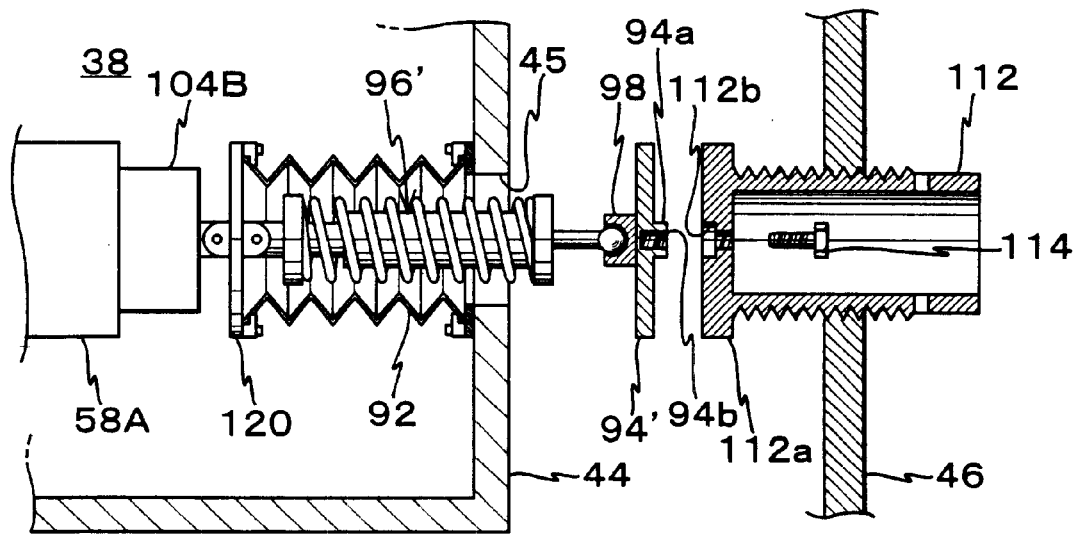
FIG. 6A is an illustration showing the configuration of a modified example of the reaction-force-discharging structure.

The configuration in the wafer chamber 38 is not limited to the above-described embodiment. As shown in FIG. 6A, for example, each bellows 92 as a sealing member may be disposed within the lower-chamber partition 44. In this case, an end of the bellows 92 is hermetically connected to the inner face of the edge around the opening 45, and an opening at the other end of the bellows 92 may be closed by a closing member 120 disposed at the side of the Y-axis guide 58A (or 58B), thereby forming the structure in the wafer chamber 38. The closing member 120 is connected to the Y-axis guide 58A (or 58B) at one side of the closing member 120 and is connected to a shock absorber 96' at the other side thereof. The shock absorber 96' is inserted into the opening 45 and through the inner space of the bellows 92, and is connected to the closing member 120 at an end thereof. The shock absorber 96' is provided at the other end thereof with a flange 94' as a mounting member (a particular member) formed in the same fashion as the flange 94 described above.

Figure 6B:
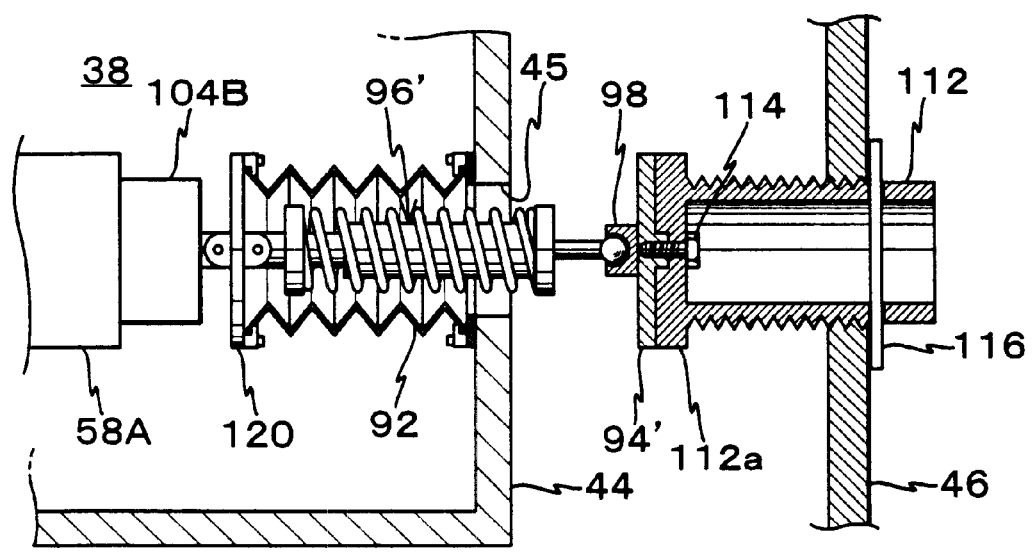
FIG. 6B is an illustration showing a method for fixing a flange and a frame flange included in the reaction-force-discharging structure shown in FIG. 6A.

The transmitting member 112 shown in FIG. 6A moves toward the lower-chamber partition 44 by rotating the transmitting member 112 in a predetermined direction and by a predetermined amount, and the flange 94' is coupled with the frame flange 112a at a convex part 94a of the flange 94' and the concave part 112b of the frame flange 112a. Then, the bolt 114 as a fixing member is inserted in an open end of the transmitting member 112, as shown in FIG. 6A, and is coupled with and screwed into a threaded hole, thereby fixing the flange 94' and the frame flange 112a to each other, as shown in FIG. 6B. Thus, the Y-axis guide 58A (or 58B) and the transmitting member 112 are connected to each other via the closing member 120, the shock absorber 96', and the flange 94'. The mounting of the wafer-chamber partition 40 to the reaction frame 46 is completed by inserting the pin 116 in a through-hole formed in each of the transmitting members 112.

In a modified example shown in FIGS. 6A and 6B, the closing members 120 are disposed within the chamber partition 44, whereby the cubic dimensions of the wafer chamber 38 can be reduced and the distance between the chamber partition 44 and the transmitting members 112 can be reduced, compared with the above-described embodiment. With this arrangement, the footprint of the apparatus can be reduced.

Figure 7A:
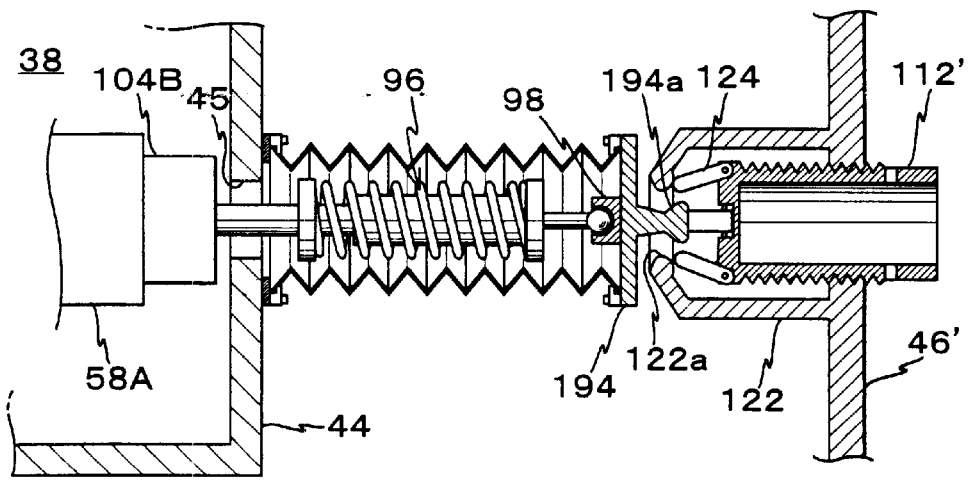
FIG. 7A is an illustration showing the configuration of another modified example of the reaction-force-discharging structure.
Figure 7B:
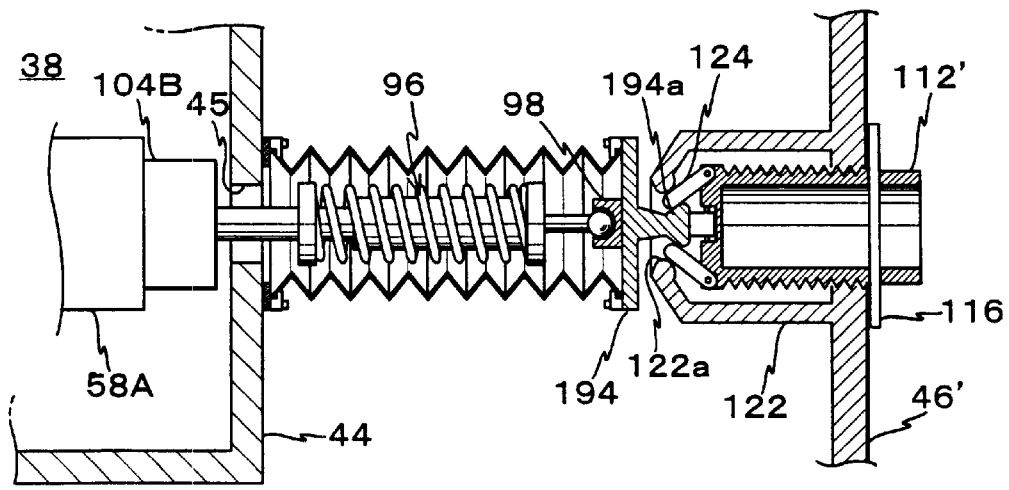
FIG. 7B is an illustration showing a method for fixing a flange and a frame flange included in the reaction-force-discharging structure shown in FIG. 7A.

When a flange as a closing member is disposed outside the chamber in the same manner as in the above-described embodiment, the flange may be fixed to the connecting member by using a fixing structure shown in FIG. 7A and FIG. 7B. In FIG. 7A, instead of the flange 94 shown in FIG. 5A, a flange 194 as a particular member is provided. The flange 194 has a protrusion 194a formed at a side of the flange 194 opposite to the side at which the shock absorber 96 is connected through a ball joint 98. In this case, a reaction frame 46' is provided instead of the reaction frame 46 shown in FIG. 5A. Reaction frame 46' includes a cylindrical hollow convex part 122 formed integrally with the reaction frame 46', an end of the convex part 122 (the end opposing the lower-chamber partition 44) being formed in a frusto-conical shape. The hollow convex part 122 is provided with an opening in the end thereof in which the protrusion 194a can be inserted. The cross section of an inner edge 122a of the opening is formed in a semicircle projecting toward the inner side. The inner edge having a projected semicircular cross section is hereinafter referred to as a stopper 122a.

A transmitting member 112', to mate with the stopper 122a, mounted on the reaction frame 46' via a threaded part is provided with a plurality of arms 124 pivotally mounted at an end of the transmitting member 112' (the end opposing the lower-chamber partition 44). The end of each arm 124 is urged to the stopper 122a by a spring member, which is not shown.

By rotating the transmitting member 112' shown in FIG. 7A in a given direction and bringing the same close to the lower-chamber partition 44, the plurality of arms 124 are pressed by the stopper 122a, whereby the arms 124 pivot against a force applied by the spring member so that the ends of the arms 124 come closer to each other. By further rotating the transmitting member 112' in the given direction, the plurality of arms 124 hold (clamp) the protrusion 194a of the flange 194, whereby the flange 194 and the transmitting member 112' are connected and fixed to each other, as shown in FIG. 7B. The mounting of the wafer-chamber partition 40 to the reaction frame 46' is completed by inserting the pin 116 in a through-hole formed in each of the transmitting members 112'.

Although a reaction-force-canceling structure using the law of conservation of momentum is used as a reaction-force-discharging structure for the reticle stage RST side as a mask stage, according to the above-described embodiment, the same reaction-force-discharging structure as is used for the wafer stage side in the first embodiment may be used for the reticle stage side, as described in the second embodiment below.

(Second Embodiment)

A second embodiment according to the invention is described below with reference to FIG. 8. The same or similar elements described in the first embodiment described above are referred to with the same reference numerals, and the description for those components is abbreviated or is omitted.

Figure 8:
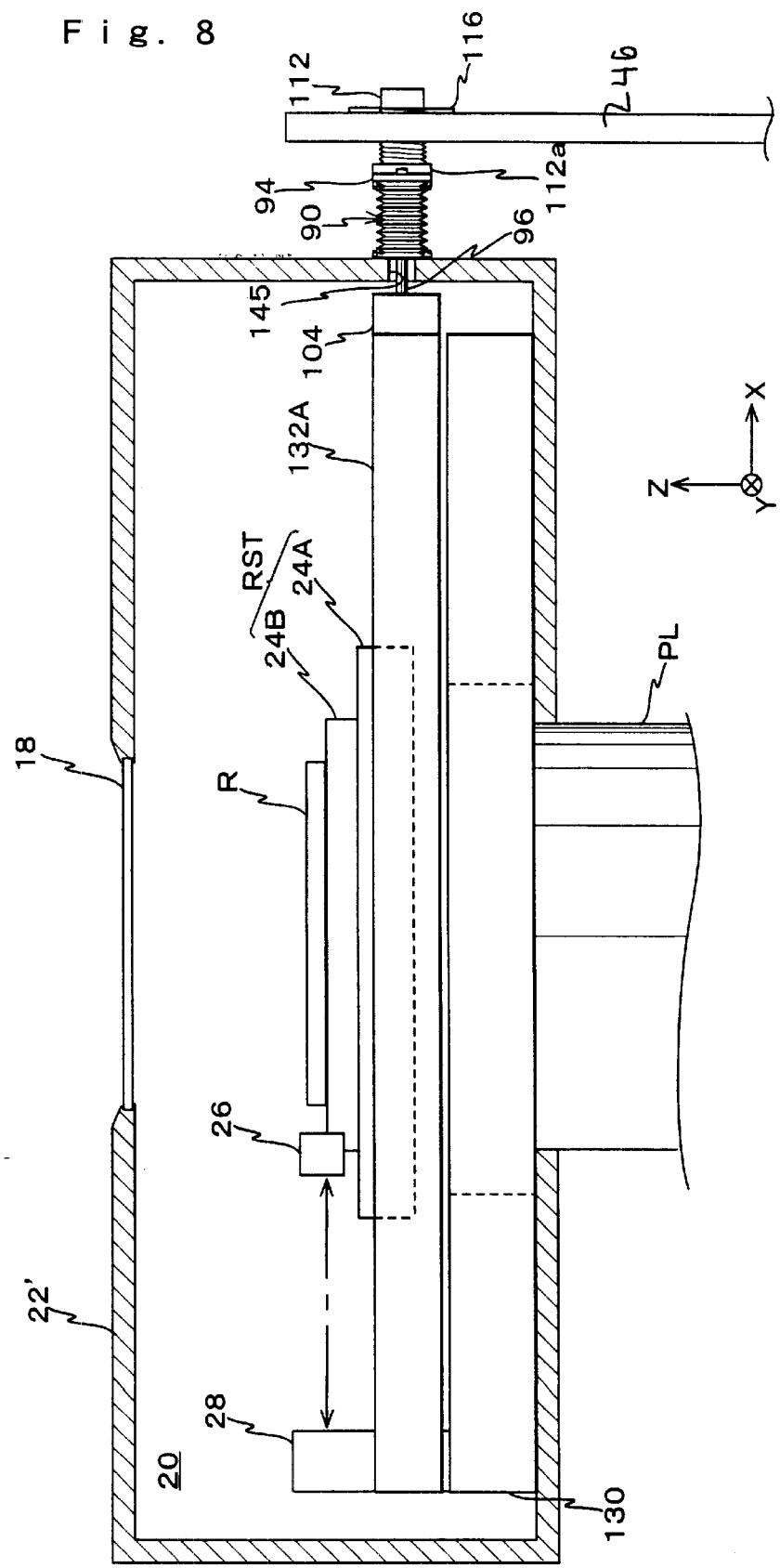
FIG. 8 is an illustration of a structure in the vicinity of a reticle chamber forming an exposure apparatus according to a second embodiment of the invention.

FIG. 8 shows a structure in the vicinity of a reticle chamber of an exposure apparatus according to the second embodiment. In the exposure apparatus according to the second embodiment, a reticle chamber 20 as an airtight chamber is defined by a reticle-chamber partition 22' provided with a light-transmitting window 18 at the ceiling thereof.

The reticle chamber 20 receives a reticle base-plate 130, a reticle stage RST as a mask stage disposed above the reticle base-plate 130, a reticle driving mechanism as a driving mechanism for driving the reticle stage RST in the X-axis direction, which is a scanning direction, and the like.

The reticle base-plate 130 is provided with an aperture at the center thereof, through which exposure beams are transmitted. Stators 132A and 132B of a pair of linear motors constituting the reticle driving mechanism are supported so as to float via gas-static-pressure bearings (not shown) above ends along the Y-axis of the reticle base-plate 130 (the stator 132B disposed at the back side of FIG. 8 is not shown). Movable members are provided at the ends along the Y-axis of a reticle scanning stage 24A constituting the reticle stage RST, for generating a driving force (Lorentz force) by a magnetic interaction with the stators 132A and 132B.

Each of the stators 132A and 132B of the pair of linear motors is connected at an end of the +X side of the stator 132A or 132B to an end of a shock absorber 96 via a mounting structure 104 formed in the same fashion as the mounting structure 104A. Each shock absorber 96 is connected at the other end thereof to a flange 94 constituting a connecting unit 90 configured in the same fashion as one of the connecting units 90A to 90D, outside the reticle-chamber partition 22' and through an opening 145 formed in the reticle-chamber partition 22'. The flange 94 is connected to a transmitting member 112 in the same manner as in the first embodiment. The transmitting member 112 is mounted on a reaction frame 146 via a threaded part, the reaction frame 146 being fixed to a floor at the lower part thereof.

The other configuration is the same as in the first embodiment described above.

In the exposure apparatus thus arranged according to the second embodiment, during scanning exposure, a reaction force is generated by driving the reticle stage RST along the X-axis. The reaction force is applied to the stators 132A and 132B, whereby the stators 132A and 132B move in a direction opposite to that of the reticle stage RST. Although the reaction force is mostly absorbed by the movement of the stators 132A and 132B, the reaction force remaining without being absorbed is transmitted to the shock absorbers 96 connected to the stators 132A and 132B. The reaction force transmitted to the shock absorbers 96 is damped, the damped force is transmitted from the shock absorbers 96 to the reaction frame 146 through the transmitting members 112, and the transmitted force is finally discharged to the floor. In this case, the force transmitted to the floor is very small. The force transmitted to legs 32A to 32D is reduced to $\mu G$ level by vibration-insulation units constituting the legs 32A to 32D. Therefore, in conclusion, the effect that a reaction force caused by driving the reticle stage RST has on a body-tube base 30 and on a projection optical system PL is negligible.

In this case, the reaction force caused by driving the reticle stage RST can be discharged to the floor via the reaction frame while maintaining the hermetic state in the reticle chamber 20.

The effect that the reaction force caused by driving a wafer stage WST, according to the second embodiment, has on the body-tube base 30 and on the projection optical system PL is also negligible, as described above.

Therefore, in the exposure apparatus according to the second embodiment, exposure is possible at an accuracy of the same level as or higher than in the exposure apparatus according to the first embodiment.

Although, according to the first and second embodiments, a reaction-force-canceling structure using the law of conservation of momentum is used at the side of the mask stage (reticle stage), and a method for discharging a reaction force to the ground via a frame is used at the side of the substrate stage (wafer stage), or the method for discharging a reaction force to the ground via a frame is used at the side of the mask stage and the side of the substrate stage, the invention is not limited to these embodiments. According to the invention, at least one of the reaction-force-discharging structures, used at the side of the mask stage and the side of the substrate stage, includes a structure in which a reaction force is discharged via a frame.

Figure 9:
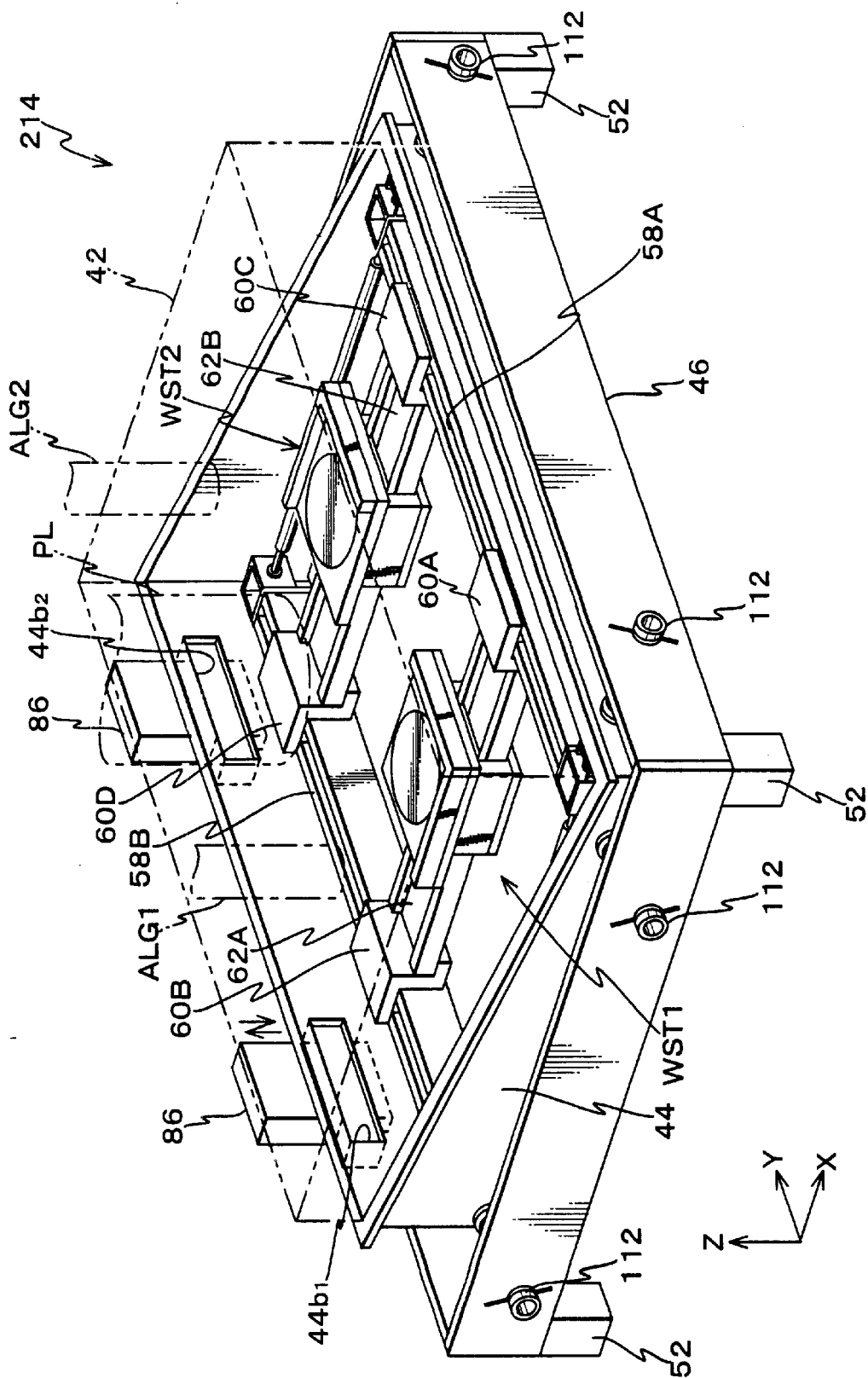
FIG. 9 is a perspective view of a modified example of a stage device.

FIG. 9 shows a modified example of the stage device 14 according to the above-described first embodiment. The same or similar elements used in the first embodiment are referred to using the same reference numerals.

A stage device 214 shown in FIG. 9 has a configuration basically the same as the stage device 14. The stage device 214 differs from the stage device 14 in that the stage device 214 includes two wafer stages. In the lower-chamber partition 44 constituting the stage device 214, X-axis guides 62A and 62B are provided, the X-axis guides 62A and 62B being configured in the same fashion as the X-axis guide 62 and moving along the Y-axis guides 58A and 58B. The X-axis guides 62A and 62B are provided with sliders 60A and 60B and sliders 60C and 60D fixed to the longitudinal ends of the X-axis guides 62A and 62B, respectively. The X-axis guides 62A and 62B are provided with wafer stages WST1 and WST2, respectively, configured in the same. fashion as the wafer stage WST. The wafer stages WST1 and WST2 are configured symmetrically with respect to each other.

The lower-chamber partition 44 is provided with wafer-loading-and-unloading ports $44b_1$ and $44b_2$ in the −X-side wall in the vicinity of the ends thereof along the Y-axis, which open and close with sliding doors 86.

The other elements are the same as that of the stage device 14 described above.

When the stage device 214 is used in an exposure apparatus, the stage device 214 is provided with a projection optical system PL in the vicinity of the center of a wafer-chamber partition 42 shown in FIG. 9, and off-axis alignment microscopes ALG1 and ALG2 at the ends of the wafer-chamber partition 42 with respect to the Y-axis.

In the thus arranged stage device 214 and an exposure apparatus using the same, when one of the wafer stages is driven by a driving mechanism (Y-linear motors and X-linear motors) disposed in a wafer chamber 38, a reaction force is generated by the driving of the wafer stage and is applied to the Y-axis guides 58A and 58B which are stators of the Y-linear motors. The reaction force is transmitted to a reaction frame 44 via transmitting members 112 by a reaction-force-discharging structure configured in the same fashion as in the first embodiment, and discharged to the floor. In this case, the gas atmosphere in the wafer chamber 38 is maintained.

In the exposure apparatus using the stage device shown in FIG. 9, an alignment sequence and an exposure sequence are preferably set so that the wafer stages WST1 and WST2 move along the Y-axis always at the same distance and in the same direction.

Although the stage device according to the invention is used in a scanning stepper, in the above description of the present embodiments, the invention is not limited to these embodiments. The stage device according to the invention is also preferably used in a stationary exposure apparatus such as a stepper in which masks and substrates are exposed while being maintained stationary. Also, in this case, accurate exposure without variations in the position of transferred images and the like is possible because a reaction force caused by driving a substrate stage supporting a substrate can be rapidly discharged to the floor.

The stage device according to the invention also preferably is used in a proximity exposure apparatus in which patterns of a mask are transferred to a substrate with the mask and substrate disposed close to each other and without using a projection optical system.

The application of the stage device according to the invention is not limited to the use in the exposure apparatus for manufacturing semiconductor devices. The stage device according to the invention may be used in an exposure apparatus for transferring device patterns to a glass plate, used for manufacturing displays, such as liquid crystal display devices and plasma displays. The stage device also may be used in an exposure apparatus for transferring device patterns to a ceramic wafer, used for manufacturing thin-film magnetic heads, and in an exposure apparatus for manufacturing image-capture devices (CCDs and the like).

The stage device according to the invention may be used not only for manufacturing micro-devices such as semiconductor devices, but also may be used in an exposure apparatus for transferring circuit patterns to a glass substrate, a silicon wafer, or the like for manufacturing reticles or masks to be used in an optical exposure apparatus, an EUV (extreme ultraviolet) exposure apparatus, an X-ray exposure apparatus, an electron-beam exposure apparatus, and the like. In an exposure apparatus using DUV (far ultraviolet) light, VUV (vacuum ultraviolet) light, or the like, a transmission-type reticle is generally used, in which a substrate is made of quartz glass, quartz glass doped with fluorine, fluorite, magnesium fluoride, rock crystal, or the like. In a proximity-type X-ray exposure apparatus, the electron-beam exposure apparatus, and the like, a transmission-type mask (stencil mask or membrane mask) is used, and in the EUV exposure apparatus, a reflective mask is used, a silicon wafer or the like being used for a substrate of the reflective mask.

The stage device according to the invention may be widely used not only in an exposure apparatus, but in other substrate processing apparatus (for example, a laser repair apparatus, a substrate inspection apparatus, and the like), and in a device for positioning samples used in a precision machine.

In the exposure apparatus according to the invention, a charged-particle-beam optical system, such as an X-ray optical system and an electron optical system, other than the projection optical system, may be used. For example, when the electron optical system is used, an optical system may be configured including an electron lens and a polarizer, and a thermoelectron-emission-type lanthanum hexaboride ($LaB_6$) or tantalum (Ta) may be used as an electron gun. The light path of the electron beam must be evacuated. In the exposure apparatus according to the invention, an EUV beam in a soft X-ray region having a wavelength of 5 to 30 nm may be used, other than the far ultraviolet or vacuum ultraviolet beam described above, as an exposure light for exposure. Also, in this case, the light path must be evacuated. According to the invention, when a vacuum chamber is used, as in these cases, a reaction force caused by driving a stage can be discharged outside the chamber via a transmitting member while maintaining the vacuum state in the chamber.

As vacuum ultraviolet light, for example, ArF-excimer laser beams or $F_2$-laser beams are used. However, the invention is not limited to this, and harmonics may be used, in which the wavelength is that of ultraviolet beams converted from infrared light oscillated by a DFB-semiconductor laser or a fiber laser, amplified by a fiber amplifier doped with, for example, erbium (or erbium and ytterbium) and by using nonlinear optical crystals.

Although a reduction system is used as the projection optical system, according to the above-described embodiments, the projection optical system also may be a unity-factor system or a magnification system.

An exposure apparatus according to the invention, such as the exposure apparatus 10 according to the present embodiments, is manufactured in a manner described below. The illumination unit including a plurality of lenses, the projection optical system, and the like are assembled in a main body of the exposure apparatus, and are optically set. The wafer-chamber partition receiving the wafer stage including a number of mechanical components and the driving mechanism for the wafer stage, the reticle-chamber partition receiving the reticle stage and the driving mechanism for the reticle stage, and the like are assembled, and the reaction frame is disposed on a floor. The wafer-chamber partition and a part of the reaction-force-discharging structure assembled as a unit are connected to the reaction frame in the above-described fashion. Thus, the mounting of a reaction-force-discharging mechanism is completed, in which a reaction force generated by driving the wafer stage applied to the Y-axis guides (stators) is discharged outside the wafer chamber via the transmitting members of which at least one part is connected to the wafer-chamber partition. The driving mechanisms, the wafer stage, the reticle stage, and other various components are mechanically and electrically assembled and set. Finally, general adjustment (electrical adjustment, operation check, and the like) is performed. The exposure apparatus is preferably manufactured in a clean room in which the temperature, cleanness, etc. are controlled.

While the invention has been described with reference to preferred embodiments thereof, it is to be understood that the invention is not limited to the preferred embodiments or constructions. To the contrary, the invention is intended to cover various modifications and equivalent arrangements. In addition, while the various elements of the preferred embodiments are shown in various combinations and configurations, which are exemplary, other combinations and configurations, including more, less or only a single element, are also within the spirit and scope of the invention.

What is claimed is:

1. A stage device comprising:
   a stage to support an object;
   an airtight chamber that encloses the stage in a hermetic state;
   a driver including a movable member connected to the stage and a stationary member that cooperates with the movable member to generate a driving force to drive the stage, the movable and stationary members of the driver disposed in the airtight chamber; and
   a reaction-force-discharging structure that discharges a reaction force applied to the stationary member, when the stage is driven by the driver, to outside of the airtight chamber, the reaction-force-discharging structure including a transmitting member, at least a part of the transmitting member is connected to the airtight chamber.

2. A stage device according to claim 1, wherein the airtight chamber encloses the stage and the driver, and the airtight chamber includes a chamber partition having an aperture therein, and further comprising:
   a hollow resilient sealing member having a first opening at a first end thereof, the first opening connected to a periphery of the aperture of the chamber partition; and
   a closing member that closes a second opening at a second end of the sealing member;
   wherein the reaction-force-discharging structure further comprises a connecting structure, at least a part of the connecting structure is inserted into an inner space of the hollow resilient sealing member, the connecting structure including a vibration-damper connected to the closing member, the connecting structure connecting the stationary member to the transmitting member.

3. A stage device according to claim 2, wherein the vibration-damper connects the stationary member and the closing member at a location disposed outside the chamber, and the closing member is connected to the transmitting member.

4. A stage device according to claim 2, wherein the connecting structure further includes a mounting member mounted on the transmitting member, the closing member is disposed in the chamber, a first side of the closing member is connected to the stationary member, and the vibration-damper connects a second side of the closing member to the mounting member.

5. A stage device according to claim 2, wherein the vibration-damper is pivotal along a plane perpendicular to an axis of the vibration-damper and along two axes perpendicular to each other.

6. A stage device according to claim 2, wherein the vibration-damper is a shock absorber having the functions of a damper and a resilient member.

7. A stage device according to claim 2, further comprising:
   an external frame dynamically isolated from the chamber partition and having the transmitting member mounted thereto.

8. A stage device according to claim 7, wherein the transmitting member is mounted on the external frame via a threaded coupling so as to be movable toward and away from the connecting structure, and the transmitting member and a particular member, which is disposed opposite to the stationary member, among the components of the connecting structure are fixed to each other via a fixing structure.

9. A stage device according to claim 8, wherein the fixing structure is a bolt having a thread to mate with a threaded hole formed in at least one of the particular member and the transmitting member, to fasten the particular member and the transmitting member to each other.

10. A stage device according to claim 8, wherein the fixing structure is a structure that holds the particular member by a movement of the transmitting member toward the connecting member.

11. A stage device according to claim 1, further comprising:
a conveyor system that loads and unloads the object to and from the airtight chamber.

12. A stage device according to claim 1, wherein the object is a mask containing a pattern, and the driver is a mask stage driver.

13. A stage device according to claim 1, wherein the object is a substrate onto which a pattern is to be formed, and the driver is a substrate stage driver.

14. A stage device according to claim 1, wherein:
there are a plurality of the stages, each stage to support an object;
the driver includes a movable member connected to each of the plurality of stages and a stationary member associated with each movable member to generate a driving force to drive each of the plurality of stages in cooperation with the movable member; and
the reaction-force-discharging structure discharges the reaction force applied to a corresponding stationary member, when at least one of the plurality of stages is driven by the driver, to outside of the airtight chamber.

15. An exposure apparatus for exposing a substrate to energy beams, thereby forming a predetermined pattern on the substrate, the exposure apparatus comprising:
a substrate stage to support the substrate;
an airtight chamber that encloses the substrate stage in a hermetic state;
a driver including a movable member connected to the substrate stage and a stationary member that generates a driving force to drive the substrate stage in cooperation with the movable member, the movable and stationary members of the driver disposed in the airtight chamber; and
a reaction-force-discharging structure that discharges a reaction force applied to the stationary member, when the substrate stage is driven by the driver, to outside of the airtight chamber, the reaction-force-discharging structure including a transmitting member, at least a part of the transmitting member is connected to the airtight chamber.

16. An exposure apparatus according to claim 15, further comprising:
a laser interferometer to determine a position of the substrate stage by measuring a length of beams, at least a part of a light path of the beams is disposed in the airtight chamber.

17. An exposure apparatus according to claim 15, further comprising:
a projection optical system to apply the energy beams to the substrate.

18. An exposure apparatus according to claim 17, further comprising:
a chamber in addition to the airtight chamber to receive the projection optical system.

19. An exposure apparatus according to claim 15, wherein the airtight chamber encloses the substrate stage and the driver, and the airtight chamber includes a chamber partition having an aperture therein, and further comprising:
a hollow resilient sealing member having a first opening at a first end thereof, the first opening connected to a periphery of the aperture of the chamber partition; and
a closing member that closes a second opening at a second end of the sealing member;
wherein the reaction-force-discharging structure further comprises a connecting structure, at least a part of the connecting structure is inserted into an inner space of the hollow resilient sealing member, the connecting structure including a vibration-damper connected to the closing member, the connecting structure connecting the stationary member to the transmitting member.

20. An exposure apparatus according to claim 19, wherein the vibration-damper connects the stationary member and the closing member at a location disposed outside the chamber, and the closing member is connected to the transmitting member.

21. An exposure apparatus according to claim 19, wherein the connecting structure further includes a mounting member mounted on the transmitting member, the closing member is disposed in the chamber, a first side of the closing member is connected to the stationary member, and the vibration-damper connects a second side of the closing member to the mounting member.

22. An exposure apparatus according to claim 19, wherein the vibration-damper is pivotal along a plane perpendicular to an axis of the vibration-damper and along two axes perpendicular to each other.

23. An exposure apparatus according to claim 19, wherein the vibration-damper is a shock absorber having the functions of a damper and a resilient member.

24. An exposure apparatus according to claim 19, further comprising:
an external frame dynamically isolated from the chamber partition and having the transmitting member mounted thereto.

25. An exposure apparatus according to claim 24, wherein the transmitting member is mounted on the external frame via a threaded coupling so as to be movable toward and away from the connecting structure, and the transmitting member and a particular member, which is disposed opposite to the stationary member, among the components of the connecting structure are fixed to each other via a fixing structure.

26. An exposure apparatus according to claim 25, wherein the fixing structure is a bolt having a thread to mate with a threaded hole formed in at least one of the particular member and the transmitting member, to fasten the particular member and the transmitting member to each other.

27. An exposure apparatus according to claim 25, wherein the fixing structure is a structure that holds the particular member by a movement of the transmitting member toward the connecting member.

28. An exposure apparatus according to claim 15, further comprising a mask stage to hold a mask containing the predetermined pattern.

29. An exposure apparatus for applying energy beams to a mask, thereby transferring a pattern of the mask onto a substrate, the exposure apparatus comprising:
a mask stage to support the mask;
a mask chamber that encloses the mask stage in a hermetic state;
a mask-driver including a movable member connected to the mask stage and a stationary member that generates a driving force to drive the mask stage in cooperation with the movable member, the movable and stationary members of the mask-driver disposed in the mask chamber; and
a reaction-force-discharging structure that discharges a reaction force applied to the stationary member, when the mask stage is driven by the mask-driver, to outside of the mask chamber, the reaction-force-discharging structure including a transmitting member, at least a part of the transmitting member is connected to the mask chamber.

30. An exposure apparatus according to claim 29, wherein the mask chamber encloses the mask stage and the mask-driver, and the mask chamber includes a chamber partition having an aperture therein, and further comprising:

a hollow resilient sealing member having a first opening at a first end thereof, the first opening connected to a periphery of the aperture of the chamber partition; and a closing member that closes a second opening at a second end of the sealing member;

wherein the reaction-force-discharging structure further comprises a connecting structure, at least a part of the connecting structure is inserted into an inner space of the hollow resilient sealing member, the connecting structure including a vibration-damper connected to the closing member, the connecting structure connecting the stationary member to the transmitting member.

31. An exposure apparatus according to claim 30, wherein the vibration-damper connects the stationary member and the closing member at a location disposed outside the mask chamber, and the closing member is connected to the transmitting member.

32. An exposure apparatus according to claim 30, wherein the connecting structure further includes a mounting member mounted on the transmitting member, the closing member is disposed in the mask chamber, a first side of the closing member is connected to the stationary member, and the vibration-damper connects a second side of the closing member to the mounting member.

33. An exposure apparatus according to claim 30, wherein the vibration-damper is pivotal along a plane perpendicular to an axis of the vibration-damper and along two axes perpendicular to each other.

34. An exposure apparatus according to claim 30, wherein the vibration-damper is a shock absorber having the functions of a damper and a resilient member.

35. An exposure apparatus according to claim 30, further comprising:

an external frame dynamically isolated from the chamber partition and having the transmitting member mounted thereto.

36. An exposure apparatus according to claim 35, wherein the transmitting member is mounted on the external frame via a threaded coupling so as to be movable toward and away from the connecting structure, and the transmitting member and a particular member, which is disposed opposite to the stationary member, among the components of the connecting structure are fixed to each other via a fixing structure.

37. An exposure apparatus according to claim 36, wherein the fixing structure is a bolt having a thread to mate with a threaded hole formed in at least one of the particular member and the transmitting member, to fasten the particular member and the transmitting member to each other.

38. An exposure apparatus according to claim 36, wherein the fixing structure is a structure that holds the particular member by a movement of the transmitting member toward the connecting member.

39. A method of making a stage device comprising the steps of:

providing a stage to support an object;

providing an airtight chamber that encloses the stage in a hermetic state;

providing a driver including a movable member connected to the stage and a stationary member that cooperates with the movable member to generate a driving force to drive the stage, the movable and stationary members of the driver disposed in the airtight chamber; and providing a reaction-force-discharging structure that discharges a reaction force applied to the stationary member, when the stage is driven by the driver, to outside of the airtight chamber, the reaction-force-discharging structure including a transmitting member, at least a part of the transmitting member is connected to the airtight chamber.

40. A method according to claim 39, wherein the airtight chamber encloses the stage and the driver, and the airtight chamber includes a chamber partition having an aperture therein, and further comprising the steps of:

providing a hollow resilient sealing member having a first opening at a first end thereof, the first opening connected to a periphery of the aperture of the chamber partition; and providing a closing member that closes a second opening at a second end of the sealing member;

wherein the reaction-force-discharging structure further comprises a connecting structure, at least a part of the connecting structure is inserted into an inner space of the hollow resilient sealing member, the connecting structure including a vibration-damper connected to the closing member, the connecting structure connecting the stationary member to the transmitting member.

41. A method according to claim 39, further comprising the steps of:

mounting the transmitting member on an external frame via a threaded coupling so as to be movable toward and away from a connecting structure that connects the transmitting member to the stationary member; and fixing the transmitting member and a particular member, which is disposed opposite to the stationary member, among the components of the connecting structure to each other via a fixing structure.

42. A method according to claim 41, wherein the fixing structure is a bolt having a thread to mate with a threaded hole formed in at least one of the particular member and the transmitting member, to fasten the particular member and the transmitting member to each other.

43. A method according to claim 39, further comprising the step of:

providing a conveyor system that loads and unloads the object to and from the airtight chamber.

44. A method of making an exposure apparatus for exposing a substrate to energy beams, thereby forming a predetermined pattern on the substrate, comprising the steps of:

providing a substrate stage to support the substrate;

providing an airtight chamber that encloses the substrate stage in a hermetic state;

providing a driver including a movable member connected to the substrate stage and a stationary member that generates a driving force to drive the substrate stage in cooperation with the movable member, the movable and stationary members of the driver disposed in the airtight chamber; and providing a reaction-force-discharging structure that discharges a reaction force applied to the stationary member, when the substrate stage is driven by the driver, to outside of the airtight chamber, the reaction-force-discharging structure including a transmitting member, at least a part of the transmitting member is connected to the airtight chamber.

45. A method according to claim 44, further comprising the step of:

providing a laser interferometer to determine a position of the substrate stage by measuring a length of beams, at least a part of a light path of the beams is disposed in the airtight chamber.

46. A method of discharging a reaction force from a stage device having a stage to support an object, an airtight chamber that encloses the stage in a hermetic state, and a driver including a movable member connected to the stage and a stationary member that cooperates with the movable member to generate a driving force to drive the stage, the movable and stationary members of the driver disposed in the airtight chamber, the method comprising the step of:

discharging a reaction force that is applied to the stationary member when the stage is driven by the driver, to outside of the airtight chamber with a transmitting member, at least a part of the transmitting member is connected to the airtight chamber.

47. A stage device according to claim 1, wherein the reaction-force-discharging structure includes a reaction force receiving portion that receives the reaction force, the reaction force receiving portion connected to the transmitting member.

48. An exposure apparatus according to claim 15, wherein the reaction-force-discharging structure includes a reaction force receiving portion that receives the reaction force, the reaction force receiving portion connected to the transmitting member.

49. An exposure apparatus according to claim 29, wherein the reaction-force-discharging structure includes a reaction force receiving portion that receives the reaction force, the reaction force receiving portion connected to the transmitting member.

50. A method according to claim 39, wherein the reaction-force-discharging structure includes a reaction force receiving portion that receives the reaction force, the reaction force receiving portion connected to the transmitting member.

51. A method according to claim 44, wherein the reaction-force-discharging structure includes a reaction force receiving portion that receives the reaction force, the reaction force receiving portion connected to the transmitting member.

* * * * *